United States Patent [19]

Hayakawa

[11] Patent Number: 5,699,002
[45] Date of Patent: Dec. 16, 1997

[54] FLIP-FLOP CIRCUIT, AND SHIFT REGISTER CIRCUIT, SERIAL-PARALLEL CONVERTER AND PARALLEL-SERIAL CONVERTER USING THE SAME

[75] Inventor: Yasushi Hayakawa, Tokyo, Japan

[73] Assignee: Mitsubishi Denki Kabushiki Kaisha, Tokyo, Japan

[21] Appl. No.: 587,476

[22] Filed: Jan. 17, 1996

[30] Foreign Application Priority Data

Jan. 19, 1995 [JP] Japan .................................. 7-006455
Jan. 11, 1996 [JP] Japan .................................. 8-003243

[51] Int. Cl.⁶ .................................................. H03K 3/289
[52] U.S. Cl. .................................. 327/202; 327/219
[58] Field of Search ............................. 327/199, 202, 327/203, 208, 210, 211, 215, 218, 219, 220, 222, 223, 225

[56] References Cited

U.S. PATENT DOCUMENTS

| | | | |
|---|---|---|---|
| 5,059,819 | 10/1991 | Tanaka et al. | 327/202 |
| 5,155,383 | 10/1992 | Barbera | 327/202 |
| 5,172,011 | 12/1992 | Leuthold et al. | 327/202 |
| 5,239,206 | 8/1993 | Yanai | 327/202 |
| 5,359,241 | 10/1994 | Hasegawa et al. | 327/202 |
| 5,552,737 | 9/1996 | Chen | 327/202 |
| 5,572,536 | 11/1996 | Thiruvengadam | 327/202 |

*Primary Examiner*—Timothy P. Callahan
*Assistant Examiner*—My-Trang Nu Ton
*Attorney, Agent, or Firm*—Oblon, Spivak, McClelland, Maier & Neustadt, P.C.

[57] ABSTRACT

The power consumption of a flip-flop circuit is reduced and an output magnitude is increased to prevent a malfunction from occurring often. In order to reduce the power consumption, an emitter-coupled logic with series gating is used for the master latch of the flip-flop circuit. A series gating is not used but an ECL having transistors connected in parallel is used for the gates of a slave latch so as to increase the output magnitude.

24 Claims, 12 Drawing Sheets

FLIP-FLOP CIRCUIT, AND SHIFT REGISTER CIRCUIT, SERIAL-PARALLEL CONVERTER AND PARALLEL-SERIAL CONVERTER USING THE SAME

BACKGROUND OF THE INVENTION

1. Field of the Invention

The present invention relates to a trigger circuit (hereinafter referred to as a flip-flop circuit) that has two states in which high and low voltage levels are output and that transfers between the states by a signal sent from the outside, and more particularly to a flip-flop circuit comprising a master latch and a slave latch which has greater logic swing on the output signal than the master latch has and that operates at a low supply voltage (which is 2 to 4.5 times as much as the voltage across the forward-biased base-emitter junction of a transistor used in the same circuit).

2. Description of the Background Art

FIG. 12 is a circuit diagram showing the structure of a flip-flop circuit according to the prior art. In FIG. 12, CR40 designates a clock buffer, CR41 designates a master latch, and CR42 designates a slave latch. The clock buffer CR40 converts the level of an input clock T. The master latch CR41 holds the logical value of an input signal D and outputs a signal D1 corresponding to the same logical value in response to the clock output from the clock buffer CR40. The slave latch CR42 holds the logical value of the signal D1 output from the master latch CR41 and outputs a signal D2 corresponding to the same logical value in response to the clock output from the clock buffer CR40.

It is assumed that the flip-flop circuit is formed by a bipolar transistor whose the voltage VBE across the forward-biased base-emitter junction is 0.9 V, first and second supply voltages VCC and VEE given to the flip-flop circuit are 0 V and −5.2 V respectively, and the input signal D and the clock T swing from −0.9 V to −1.5 V. In this case, the clock buffer CR40 lowers a voltage level which is the center of the magnitude of the clock, and outputs a clock which swings from −1.8 V to −2.4 V. The master latch CR41 outputs a signal D1 having the same magnitude and the same voltage level of the magnitude center as those of the input signal D on receipt of the input signal D and the clock output from the clock buffer CR40. The slave latch CR42 outputs a signal D2 having the same magnitude and the same voltage level of the magnitude center as those of the input signal D on receipt of the input signal D1 and the clock output from the master latch CR41.

The structure and operation of each portion which forms the flip-flop circuit shown in FIG. 12 will be described below. First and second reference voltages VBB1 and VBB2 given to the master latch CR41 and the slave latch CR42 are −1.3 V and −2.2 V, respectively. In the clock buffer CR40, Q14 designates an NPN bipolar transistor and R11 designates a resistor. The NPN bipolar transistor Q14 has a base for receiving the clock T, a collector to which the first supply voltage VCC is given, and an emitter for outputting a clock whose voltage level is converted. The resistor R11 has a first end connected to the emitter of the transistor Q14, and a second end to which the second supply voltage VEE is given. When the clock T swinging from −0.9 V to −1.5 V is input to the base of the transistor Q14, a clock swinging from −1.8 V to −2.4 V is output to the emitter of the transistor Q14.

In the master latch CR41, R1 and R2 designate resistors, Q1 to Q6 designate NPN bipolar transistors, I1 designates a constant current source, Q8 and Q9 designate NPN bipolar transistors, and R4 and R5 designate resistors. The resistor R1 has a first end to which the first supply voltage VCC is given, and a second end. The NPN bipolar transistor Q1 has an emitter, a base to which an input signal D is sent, and a collector connected to the second end of the resistor R1. The resistor R2 has a first end to which the first supply voltage VCC is given, and a second end. The NPN bipolar transistor Q2 has a collector connected to the second end of the resistor R2, a base to which the first reference voltage VBB1 is given, and an emitter connected to the emitter of the transistor Q1. The NPN bipolar transistor Q3 has an emitter, a collector connected to the emitter of the transistor Q1, and a base to which the second reference voltage VBB2 is given. The NPN bipolar transistor Q4 has a base, an emitter and a collector connected to the second end of the resistor R1. The NPN bipolar transistor Q5 has a base, a collector connected to the second end of the resistor R2, and an emitter connected to the emitter of the transistor Q4. The NPN bipolar transistor Q6 has a collector connected to the emitters of the transistors Q4 and Q5, a base connected to the emitter of the transistor Q14, and an emitter connected to the emitter of the transistor Q3. The constant current source I1 has a first end connected to the emitters of the transistors Q3 and Q6 and a second end to which the second supply voltage VEE is given, and outputs a predetermined current. The NPN bipolar transistor Q8 has a base connected to the second end of the resistor R1, a collector to which the first supply voltage VCC is given, and an emitter connected to the base of the transistor Q5. The NPN bipolar transistor Q9 has a collector to which the first supply voltage VCC is given, a base connected to the second end of the resistor R2, and an emitter connected to the base of the transistor Q4. The resistors R4 and R5 have first ends connected to the emitters of the transistors Q8 and Q9, and second ends to which the second supply voltage VEE is given, respectively.

The constant current source I1 comprises an NPN bipolar transistor Q7 and a resistor R3. The NPN bipolar transistor Q7 has an emitter, a collector which is the first end of the constant current source I1, and a base to which a voltage VCS having a predetermined potential difference from the second supply voltage VEE is given. The resistor R3 has a first end connected to the emitter of the transistor Q7, and a second end which is the second end of the constant current source I1.

If a signal D input to the base of the transistor Q1 swings from −0.9 V to −1.5 V, the collector of the transistor Q1 generates a signal swinging from 0 V to −0.6 V. More specifically, when the transistor Q3 is in the ON state, the transistor Q1 is turned ON if the voltage of the base of the transistor Q1 becomes −0.9 V. Consequently, the voltage of the second end of the resistor R1 becomes −0.6 V. If the voltage of the base of the transistor Q1 becomes −1.5 V, the transistor Q1 is turned OFF so that the voltage of the second end of the resistor R1 becomes 0 V. The transistors Q1 and Q2 are turned ON and OFF complimentarily to each other. For this reason, when the transistor Q1 is turned ON, on the second end of the resistor R2 is generated a voltage of 0 V. When the transistor Q1 is turned OFF, a voltage of −0.6 V is generated on the second end of the resistor R2.

The emitters of the transistors Q8 and Q9 generate a signal D1 swinging from −0.9 V to −1.5 V in response to the signals generated on the collectors of the transistors Q1 and Q2. When the transistor Q6 is turned ON by the clock output from the clock buffer CR40, either of the transistors Q4 and Q5 is always turned ON because their bases receive the signal D1. Each of the emitters of the transistors Q4 and Q5, i.e., the voltage of the collector of the transistor Q6 becomes −1.8 V. However, when the transistor Q6 is turned OFF by the clock output from the clock buffer CR40, both the transistors Q4 and Q5 are in a non-operative condition. Consequently, a current is sent to neither the transistor Q4 nor the transistor Q5. The transistors Q1 to Q6 operate in a non-saturation area.

Also in the slave latch CR42, transistors Q1' to Q7' which correspond to the transistors Q1 to Q7 of the master latch CR41 are connected in the same manner as in the master latch CR41. The master latch CR41 is different from the slave latch CR42 in the following respects. More specifically, the transistors Q8 and Q9 of the master latch CR41 simultaneously send signals to the slave latch CR42 and to the transistors Q4 and Q5. On the other hand, transistors Q12 and Q13 for externally outputting the output signals Q and QC of the slave latch CR42 and transistors Q10 and Q11 for generating signals which are sent to the transistors Q4' and Q5' are separately provided.

The bases of the transistors Q10 and Q12 are connected to the second end of a resistor R1' in common. The bases of the transistors Q11 and Q13 are connected to the second end of a resistor R2' in common. Resistors R7 to R10 are provided. They have first ends connected to the emitters of the transistors Q10 to Q13 respectively and second ends to which the second supply voltage VEE is given. The transistors Q12 and Q13 are emitter followers which form the output stage of the slave latch CR42.

The slave latch CR42 operates in the same manner as the master latch CR41, and inputs the signal D1 swinging from −0.9 V to −1.5 V and outputs the signal D2 (Q) swinging from −0.9 V to −1.5 V.

The flip-flop circuit according to the prior art has the structure described above. Therefore, when the difference between the first and second supply voltages VCC and VEE which cause the flip-flop circuit to operate is low, for example, 3.3 V, the flip-flop circuit does not operate stably irrespective of the values of the first and second reference voltages VBB1 and VBB2 and the voltage VCS. The reason is that the transistors Q8, Q5, Q6 and Q7 are connected in series and the transistors Q9, Q4, Q6 and Q7 are connected in series.

As shown in FIG. 11, the transistors Q8 and Q9 and the transistors Q10 and Q11 are removed from FIG. 12, the bases of the transistors Q4 and Q5 are connected to the second ends of the resistors R1 and R2 respectively, and the bases of the transistors Q4' and Q5' are connected to the resistors R1' and R2' respectively. Consequently, the number of transistors connected in series between the supply voltages VCC and VEE is decreased by 1. Thus, the flip-flop circuit can operate even if the difference between the supply voltages VCC and VEE is 3.3 V.

In the case where the flip-flop circuit has a structure shown in FIG. 11, the magnitude center of the input signal D should be set to −0.15 V and the magnitude should be restricted to 0 V to −0.3 V, and the magnitude center of the output signal should be set to −0.95 V and the magnitude should be restricted to −0.8 V to −1.1 V.

The magnitude of output signal of the flip-flop circuit is also restricted to 300 mV. For this reason, the signal output from the flip-flop circuit is apt to be influenced by a noise or attenuated during transmission on a wiring. In an integrated circuit using such a flip-flop circuit, a malfunction may easily occur. Thus, the magnitude is restricted because the constant current transistors Q1 and Q3, Q2 and Q3, Q4 and Q6, and Q5 and Q6 are connected in series in the current path of the constant current source I1 in the master latch CR41.

If the difference between the supply voltages is reduced, the center of the logic swing of the input signal D is shifted from an appropriate voltage level at which each of the input terminals of the master latch CR41 and the slave latch CR42, i.e., the base of the transistor Q1 operates suitably. For this reason, in the case where the levels of the magnitude centers and the magnitudes of the input and output signals are standardized, for example, the input and output signals should have a magnitude of −1.05 V to −1.55 V and are hard to change as in an integrated circuit using a gate array, it is difficult to apply a flip-flop circuit formed by an emitter-coupled logic with series gating.

SUMMARY OF THE INVENTION

A first aspect of the present invention is directed to a flip-flop circuit formed in a semiconductor integrated circuit for operating on receipt of first and second supply voltages having a difference of 2 to 4.5 times as much as the voltage across the forward-biased base-emitter junction of a bipolar transistor comprising an input level converter for receiving an input signal having a magnitude which is based on a first voltage level between the first and second supply voltages and whose peak value does not reach the first and second supply voltages, and for outputting, in response to the input signal, a first signal having a magnitude which is based on a second voltage level closer to the first supply voltage than the first voltage level between the first and second supply voltages and whose peak value reaches the first supply voltage, a master latch including an emitter-coupled logic with series gating for inputting the first signal and a clock having a magnitude which is based on a third voltage level closer to the second supply voltage than the second voltage level between the first and second supply voltages, and for holding a logical value of the first signal and outputting a second signal having a magnitude which is based on a fourth voltage level that is almost the same as the second voltage level and whose peak value reaches the first supply voltage in response to the logical value of the first signal which is held, and a slave latch for inputting the second signal, and for holding the logical value of the second signal and outputting a third signal having a magnitude which is based on a fifth voltage level that is almost the same as the first voltage level in response to the logical value of the second signal which is held, wherein the magnitude of the third signal is set greater than the magnitude of the second signal.

A second aspect of the present invention is directed to the flip-flop circuit according to the first aspect of the present invention, wherein the slave latch comprises an intermediate signal level converting portion for inputting the second signal, and for outputting, in response to the second signal, a fourth signal having a magnitude which is based on a sixth voltage level closer to the second supply voltage than the first voltage level between the first and second supply voltages, and a latch portion for inputting the clock and the fourth signal, and for holding a logical value of the fourth signal and outputting the third signal in response to the logical value of the fourth signal which is held, wherein the latch portion has gates only connected in parallel for logical operation.

A third aspect of the present invention is directed to the flip-flop circuit according to the first aspect of the present invention, wherein the slave latch comprises a latch portion including an emitter-coupled logic with series gating for inputting the clock and the second signal, and for holding the logical value of the second signal and outputting a fourth signal having a magnitude which is based on the third voltage level in response to the logical value of the second signal which is held, and an output level converting portion for inputting the fourth signal, and for generating and outputting the third signal in response to the fourth signal.

A fourth aspect of the present invention is directed to the flip-flop circuit according to any of the first to third aspects of the present invention, wherein the semiconductor integrated circuit includes a gate array large-scale integrated circuit formed by a plurality of transistors which are provided in an array on a semiconductor substrate, and wherein the input level converter, the master latch and the slave latch are used for the gate array large-scale integrated circuit.

A fifth aspect of the present invention is directed to a shift register circuit which is formed in a semiconductor integrated circuit and uses a plurality of flip-flop circuits according to any of the first to fourth aspects of the present invention.

A sixth aspect of the present invention is directed to a serial-parallel converter which is formed in a semiconductor integrated circuit and uses a plurality of flip-flop circuits according to any of the first to fourth aspects of the present invention.

A seventh aspect of the present invention is directed to a parallel-serial converter which is formed in a semiconductor integrated circuit and uses a plurality of flip-flop circuits according to any of the first to fourth aspects of the present invention.

An eighth aspect of the present invention is directed to a flip-flop circuit for operating on receipt of first and second supply voltages having a difference of 2 to 4.5 times as much as the voltage across the forward-biased base-emitter junction of a bipolar transistor and a third supply voltage having a predetermined relationship with the first and second supply voltages comprising an input level converter for receiving an input signal having a magnitude which is based on a first voltage level between the first and second supply voltages and whose peak value does not reach the first and second supply voltages, and for outputting, in response to the input signal, a first signal having a magnitude which is based on a second voltage level closer to the first supply voltage than the first voltage level and whose peak value reaches the first supply voltage, a master latch including an emitter-coupled logic with series gating for inputting the first signal and a clock having a magnitude which is based on a third voltage level closer to the second supply voltage than the second voltage level, and for holding a logical value of the first signal and outputting a second signal having a magnitude which is based on the third voltage level in response to the logical value of the first signal which is held, and a slave latch for inputting the second signal, and for holding a logical value of the second signal and outputting a third signal having a magnitude which is based on a fourth voltage level between the first and third supply voltages in response to the logical value of the second signal which is held, wherein the predetermined relationship means that the first supply voltage is present between the second and third supply voltages.

A ninth aspect of the present invention is directed to a flip-flop circuit for operating on receipt of first and second supply voltages having a difference of 2 to 4.5 times as much as the voltage across the forward-biased base-emitter junction of a bipolar transistor and a third supply voltage having the predetermined relationship with the first and second supply voltages comprising an input level converter for receiving an input signal having a magnitude which is based on a first voltage level between the first and third supply voltages, and for outputting, in response to the input signal, a first signal having a magnitude which is based on a second voltage level closer to the first supply voltage than the average of the first and second supply voltages between the first and second supply voltages and whose peak value reaches the first supply voltage, a master latch including an emitter-coupled logic with series gating for inputting the first signal and a clock having a magnitude which is based on a third voltage level closer to the second supply voltage than the second voltage level, and for holding a logical value of the first signal and outputting a second signal having a magnitude which is based on the third voltage level in response to the logical value of the first signal which is held, and a slave latch for inputting the second signal, and for holding a logical value of the second signal and outputting a third signal having a magnitude which is based on a fourth voltage level that is almost the same as the first voltage level in response to the logical value of the second signal which is held, wherein the predetermined relationship means that the first supply voltage is present between the second and third supply voltages.

According to the first aspect of the present invention, the third signal output from the slave latch has a greater magnitude than that of the second signal so that it is rarely influenced by a noise during transmission. Consequently, the semiconductor integrated circuit including the flip-flop circuits can operate stably.

Further, the third signal output from the slave latch has a magnitude which is based on the fifth voltage level that is almost the same as the first voltage level as the magnitude center of the input signal. In addition, the magnitude center of the input signal almost corresponds to that of the third signal. Consequently, connection to another circuit can easily be obtained so that the time necessary for the design of the semiconductor integrated circuit can be shortened.

According to the second aspect of the present invention, the latch portion of the slave latch is formed by only the gates connected in parallel. The master latch includes an emitter-coupled logic with series gating. Consequently, at least one of the bipolar transistors connected in series can be reduced in the slave latch so that the logic swing of the output of the slave latch can easily be set greater by the threshold voltage of one of the bipolar transistors than that of the output of the master latch. In addition, the master latch side includes an emitter-coupled logic with series gating so that power consumption can be reduced.

Accordingly, even if the supply voltage is low, the logic swing of the output of the slave latch is set greater than that of the output of the master latch so that the malfunction of the semiconductor integrated circuit including the flip-flop circuits can be prevented from occurring and the power consumption can be reduced.

According to the third aspect of the present invention, even if the supply voltage is low, the logic swing of the output of the slave latch can be set greater than that of the output of the master latch so that the malfunction of the semiconductor integrated circuit including the flip-flop circuits can be prevented from occurring.

According to the fourth aspect of the present invention, the flip-flop circuit is formed by a gate array. Since the magnitude center of the input signal almost corresponds to that of the third signal, design can be simplified.

According to the fifth, sixth and seventh aspects of the present invention, a plurality of flip-flop circuits according to any of the first to fourth aspects of the present invention are used so that restrictions on the design of a wiring length and the like can be relaxed and the placement and routing can easily be obtained. Consequently, the automatic placement and routing can easily be obtained for the same reason.

According to the eighth aspect of the present invention, the magnitude of the third signal output from the slave latch can easily be set greater than that of the second signal. When the magnitude of the third signal is set greater, it is rarely influenced by a noise during transmission. Consequently, the semiconductor integrated circuit including the flip-flop circuits can operate stably.

The third signal output from the slave latch has a magnitude which is based on the fourth voltage level between the first and third supply voltages. Consequently, connection to another circuit which operates on receipt of the first and third supply voltages can easily be obtained so that the semiconductor integrated circuit can easily be designed.

According to the ninth aspect of the present invention, the third signal output from the slave latch has a greater magnitude than that of the second signal so that it is rarely influenced by a noise during transmission. Consequently, the semiconductor integrated circuit including the flip-flop circuits can operate stably.

The input signal has a magnitude which is based on the fourth voltage level between the first and third supply voltages. Consequently, connection to another circuit which operates on receipt of the first and third supply voltages can easily be obtained so that the semiconductor integrated circuit can easily be designed.

It is an object of the present invention to provide a flip-flop circuit in which a signal is rarely influenced by a noise or attenuated during transmission on a wiring.

It is another object of the present invention to provide a flip-flop circuit which operates at a low supply voltage that is 2 to 4.5 times as much as the base-emitter junction forward voltage of a bipolar transistor capable of outputting signals corresponding to the standardized input and output signals.

It is yet another object of the present invention to provide a flip-flop circuit which is applied to an integrated circuit using the standardized input and output signals such as a gate array, and which can easily be designed and prevent a malfunction from occurring.

These and other objects, features, aspects and advantages of the present invention will become more apparent from the following detailed description of the present invention when taken in conjunction with the accompanying drawings.

DESCRIPTION OF THE PREFERRED EMBODIMENTS (Embodiment 1)

Figure 1:
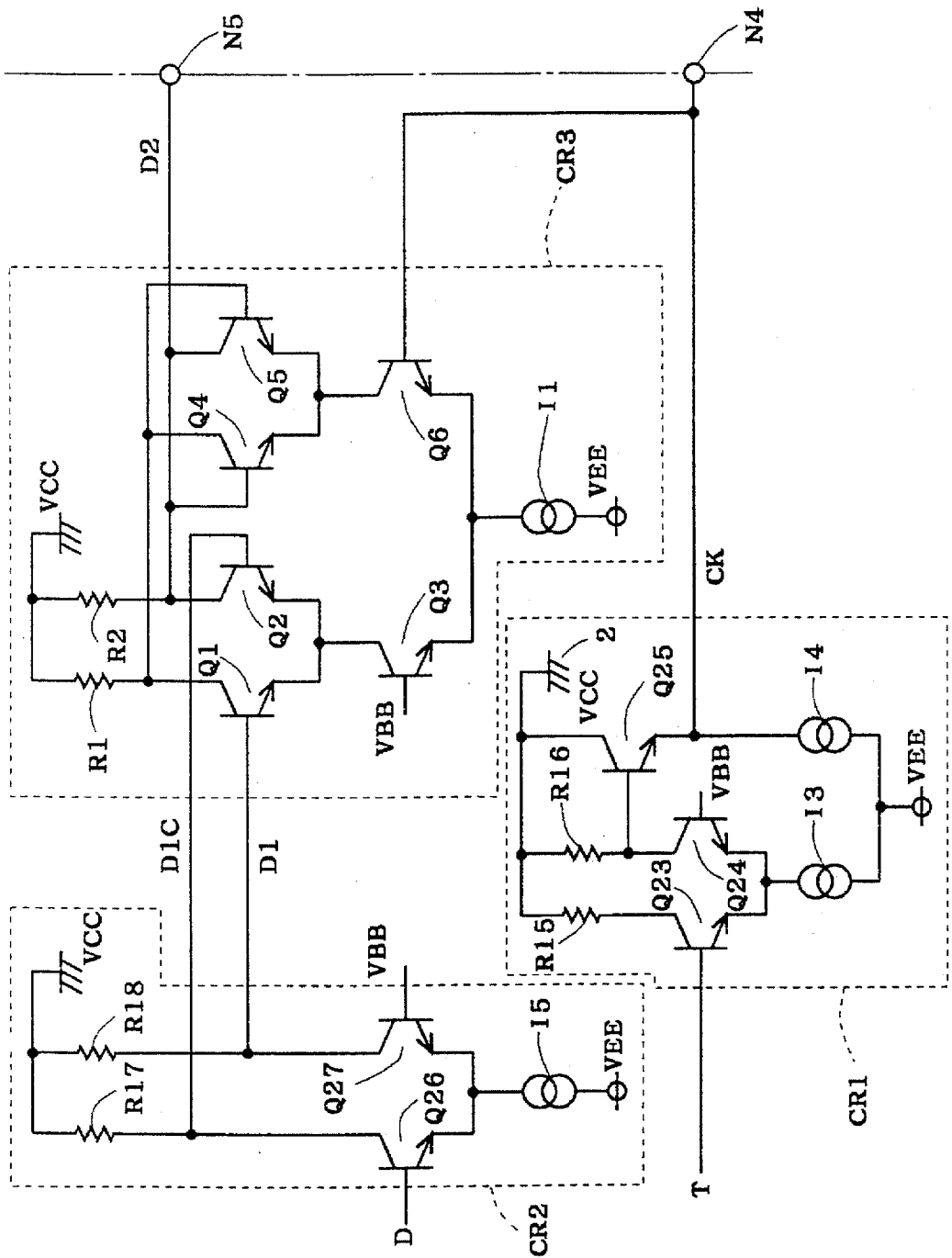
FIG. 1 is a circuit diagram showing the first stage of the structure of a flip-flop circuit according Embodiment 1 of the present invention.
Figure 2:
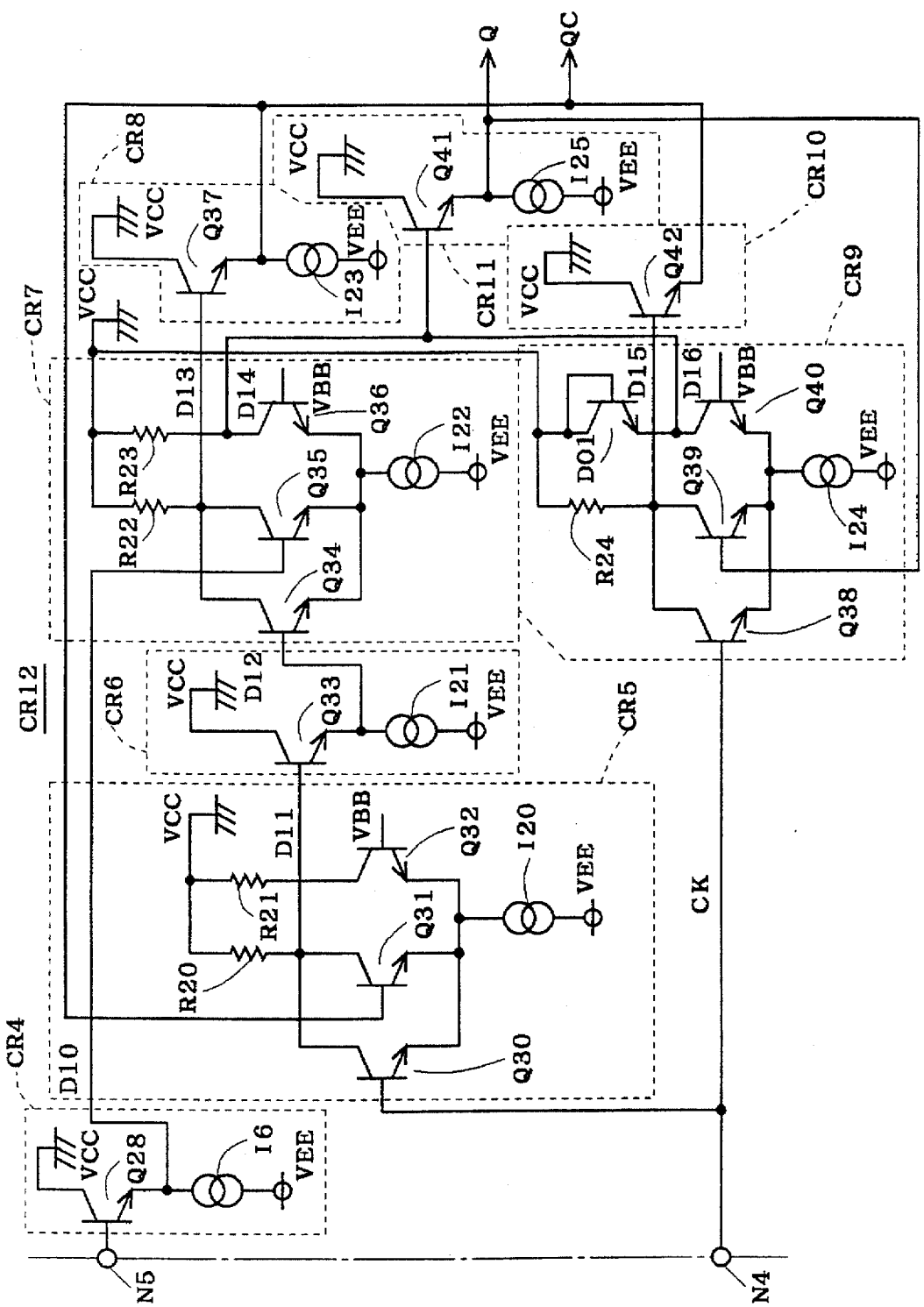
FIG. 2 is a circuit diagram showing the second stage of the structure of the flip-flop circuit according to Embodiment 1 of the present invention.

A flip-flop circuit according to Embodiment 1 of the present invention will be described below with reference to FIGS. 1 and 2. FIGS. 1 and 2 are circuit diagrams showing the structure of the flip-flop circuit according to Embodiment 1 of the present invention. In FIGS. 1 and 2, CR1 designates a clock buffer, CR2 designates an input level converter, CR3 designates a master latch, N4 and N5 designate nodes, CR4 designates an intermediate level converter, CR5 designates a NOR gate, CR6 designates a level converter, CR7 designates a logic gate, CR8 designates an emitter follower, CR9 designates a logic gate, and CR10 and CR11 designate emitter followers. The clock buffer CR1 inputs a clock T and outputs an internal clock CK. The input level converter CR2 converts the level of an input signal D and outputs a signal D1 and a complementary signal D1C. The master latch CR3 holds the logical values of the signals D1 and D1C in response to the clock CK, and outputs a signal D2 in response to the logical values which are held. The output terminal of the clock buffer CR1 (the emitter of a transistor Q25) is connected to the node N4. The output terminal of the master latch CR3 (the second end of a resistor R2) is connected to the node N5. The intermediate level converter CR4 shifts the voltage level of the output signal D2 of the master latch CR3 and outputs a signal D10. The NOR gate CR5 formed by an ECL NORs the clock CK and the inverted output QC of the flip-flop circuit, and outputs a signal D11 indicative of the result of NOR. The level converter CR6 converts the voltage level of the magnitude center of the signal D11 output from the NOR gate CR5, and outputs a signal D12. The logic gate CR7 formed by the ECL NORs the signals D10 and D12 and outputs a signal D14 indicative of the result of NOR, and ORs the signals D10 and D12 and outputs a signal D13 indicative of the result of OR. The emitter follower CR8 performs impedance conversion to externally output the signal D13. The logic gate CR9 NORs the clock CK and the output Q of the flip-flop circuit and outputs a signal D15 indicative of the result of NOR, and ORs the clock CK and the output Q of the flip-flop circuit and outputs a signal D16 indicative of the result of OR. The emitter follower CR10 performs impedance conversion to externally output the signal D15. The emitter follower CR11 performs impedance conversion to externally output AND of the signals D14 and D16.

A slave latch CR12 comprises the intermediate level converter CR4, the NOR gate CR5, the level converter CR6, the logic gates CR7 and CR9, and the emitter followers CR8, CR10 and CR11.

According to the flip-flop circuit shown in FIGS. 1 and 2, the input signal D and the clock CK swing from −0.8 V to −1.1 V, for example. The flip-flop circuit is formed by a bipolar transistor whose voltage VBE across the forward biased base-emitter junction is 0.8 V. The input level converter CR2 receives the input signal D, converts the voltage level of the magnitude center and outputs the signals D1 and D1C swinging from 0 V to 0.3 V, for example.

The intermediate level converter CR4 converts the level of the signal D2 output from the master latch CR3 and outputs the signal D10. Assuming that the signal D2 swinging from 0 V to −0.3 V is generated on the second end of the resistor R2 of the master latch CR3, the intermediate level converter CR4 inputs the signal D2 and outputs the signal D10 swinging from −0.8 V to −1.1 V which is lower by the voltage VBE across the forward-biased base-emitter junction of a transistor Q28.

The NOR gate CR5 ORs the inverted output bar Q of the flip-flop circuit which swings from −0.8 V to −1.6 V and the clock CK swinging from −0.8 V to −1.1 V, and outputs the signal D11 swinging from 0 V to −0.8 V. The level converter CR6 converts the signal D11 to the signal D12 swinging from −0.8 V to −1.1 V and outputs the signal D12. The logic gate CR7 ORs and NORs the signal D10 swinging from −0.8 V to −1.1 V and the signal D12 swinging from −0.8 V to −1.1 V, and outputs the signals D14 and D13 swinging from 0 V to −0.8 V as the results of OR and NOR. The logic gate CR9 ORs and NORs the signal Q swinging from −0.8 V to −1.6 V and the clock CK swinging from −0.8 V to −1.1 V, and outputs the signals D16 and D15 swinging from 0 V to −0.8 V as the results of OR and NOR.

The emitter followers CR8 and CR10 serve to externally transmit the signals D13 and D15 output from the logic gates CR7 and CR9. The emitters of transistors Q37 and Q42 of the emitter followers CR8 and CR10 are connected to each other so that a wired OR is formed. The emitter followers CR8 and CR10 ORs the respective outputs, and output the result of OR as the output QC of the flip-flop circuit.

The collectors of transistors Q36 and Q40 are connected to the base of a transistor Q41 of the emitter follower CR11 to form a wired AND. For this reason, the emitter follower CR11 ANDs the signals D14 and D16 and outputs the result of AND as the output Q of the flip-flop circuit. The output of the emitter follower CR11 is the output Q of the flip-flop circuit. If the signals D14 and D16 swing from 0 V to −0.8 V, the output Q of the flip-flop circuit swings from −0.8 V to −1.6 V.

The signals CK and Q having different magnitudes are input to the logic gate CR9. Both signals have magnitudes at higher and lower voltages than a reference voltage VBB. If the reference voltage VBB is −0.95 V, the clock CK swings from −0.8 V to −1.1 V and the output Q swings from −0.8 V to −1.6 V. The logical operation is correctly executed at each logic gate.

The components CR1 to CR11 which form the flip-flop circuit will be described below.

In the clock buffer CR1, I3 and I4 designate constant current sources, Q23 to Q25 designate NPN bipolar transistors, and R15 and R16 designate resistors. The constant current source I3 has a first end and a second end to which a first supply voltage VEE is given. The constant current source I4 has a first end and a second end to which the first supply voltage VEE is given. The NPN bipolar transistor Q23 has a collector, an emitter connected to the constant current source I3, and a base for receiving a clock T. The NPN bipolar transistor Q24 has a collector, an emitter connected to the first end of the constant current source I3, and a base to which the reference voltage VBB is given. The resistor R15 has a first end to which a second supply voltage VCC is given, and a second end connected to the collector of the transistor Q23. The resistor R16 has a first end to which the second supply voltage VCC is given, and a second end connected to the collector of the transistor Q24. The NPN bipolar transistor Q25 has a base connected to the second end of the resistor R16, a collector to which the second supply voltage VCC is given, and an emitter connected to the first end of the constant current source I4.

It is assumed that the clock T input to the transistor Q23 swings from −0.8 V to −1.1 V. The clock T is shaped into a waveform by an ECL circuit comprised of the transistors Q23 and Q24, and the magnitude and the voltage level of the magnitude center are converted. A binary signal swinging from 0 V to −0.3 V is output to the second end of the resistor R16 in response to the clock T. The transistor Q25 shifts the signal value output to the second end of the resistor R16 and outputs a clock CK which is a binary signal swinging from −0.8 V to −1.1 V.

In the input level converter CR2, I5 designates a constant current source, Q26 and Q27 designate NPN bipolar transistors, and R17 and R18 designate resistors. The constant current source I5 has a first end and a second end to which the second supply voltage VEE is given. The NPN bipolar transistor Q26 has a collector, a base for receiving the input signal D, and an emitter connected to the first end of the constant current source I5. The NPN bipolar transistor Q27 has a collector, an emitter connected to the emitter of the transistor Q26, and a base to which the reference voltage VBB is given. The resistor R17 has a first end to which the first supply voltage VCC is given, and a second end connected to the collector of the transistor Q26. The resistor R18 has a first end to which the first supply voltage VCC is given, and a second end connected to the collector of the transistor Q27.

For example, the signal D input to the transistor Q26 is a binary signal swinging from −0.8 V to −1.1 V and its voltage level is shifted by an ECL comprised of the transistors Q26 and Q27. A signal D1 having the same logical value as that of the signal D is output from the second end of the resistor R18. A signal D1C which is complementary to the signal D1 output from the second end of the resistor R18 is output from the second end of the resistor R17.

In the master latch CR3, Q1 to Q5 designate NPN bipolar transistors, R1 and R2 designate resistors, and I1 designates a constant current source. The NPN bipolar transistor Q1 has an emitter, a collector and a base for receiving the signal D1 output from the input level converter CR2. The NPN bipolar transistor Q2 has a collector, an emitter connected to the emitter of the transistor Q1, and a base for receiving the signal D1C output from the input level converter CR2. The resistor R1 has a first end to which the first supply voltage VCC is given, and a second end connected to the collector of the transistor Q1. The resistor R2 has a first end to which the first supply voltage VCC is given, and a second end connected to the collector of the transistor Q2. The NPN bipolar transistor Q3 has an emitter, a collector connected to the emitters of the transistors Q1 and Q2 in common, and a base for receiving the reference voltage VBB. The NPN bipolar transistor Q4 has an emitter, a collector connected to the second end of the resistor R1, and a base connected to the second end of the resistor R2. The NPN bipolar transistor Q5 has an emitter connected to the emitter of the transistor Q4, a collector connected to the second end of the resistor R2, and a base connected to the second end of the resistor R1. The NPN bipolar transistor Q6 has an emitter, a collector connected to the emitters of the transistors Q4 and Q5 in common, and a base for receiving the clock CK. The constant current source I1 has a first end connected to the emitters of the transistors Q3 and Q6 in common, and a second end to which the second supply voltage VEE is given.

In the intermediate level converter CR4, Q28 designates an NPN bipolar transistor and I6 designates a constant current source. The NPN bipolar transistor Q28 has an emitter, a collector to which the first supply voltage VCC is given, and a base connected to the node N5. The constant current source I6 has a first end connected to the emitter of the transistor Q28, and a second end to which the second supply voltage VEE is given.

For example, when a signal swinging from 0 V to −0.3 V is sent to the base of the transistor Q28, the emitter of the transistor Q28 outputs a signal D10 swinging from −0.8 V to −1.1 V which is dropped by the base-emitter forward voltage VBE of the transistor Q28.

In the NOR gate CR5, Q30 designates an NPN bipolar transistor, Q31 designates an NPN bipolar transistor, R20 designates a resistor, Q32 designates an NPN bipolar transistor, R21 designates a resistor, and I20 designates a constant current source. The NPN bipolar transistor Q30 has an emitter, a collector and a base connected to the node N4. The NPN bipolar transistor Q31 has a collector, an emitter connected to the emitter of the transistor Q30, and a base to which the inverted output QC of the flip-flop circuit is sent. The resistor R20 has a first end to which the first supply voltage VCC is given, and a second end connected to the collectors of the transistors Q30 and Q31 in common. The NPN bipolar transistor Q32 has a collector, an emitter connected to the emitters of the transistors Q30 and Q31 in common, and a base to which the reference voltage VBB is given. The resistor R21 has a first end to which the first supply voltage VCC is given, and a second end connected to the collector of the transistor Q32. The constant current source I20 has a first end connected to the emitters of the transistors Q30 to Q32 in common, and a second end to which the second supply voltage VEE is given.

For example, the clock CK swinging from −0.8 V to −1.1 V and the output Q of the flip-flop circuit which swings from −0.8 V to −1.6 V are sent to the bases of the transistors Q30 and Q31. When both the transistors Q30 and Q31 are in the OFF state or either of them is in the ON state, a voltage is dropped on the resistor R20 by the constant current of the constant current source I20 so that a signal D11 swinging from 0 V to −0.8 V is output from the second end of the resistor R20.

In the level converter CR6, Q33 designates an NPN bipolar transistor and I21 designates a constant current source. The NPN bipolar transistor Q33 has an emitter, a collector to which the first supply voltage VCC is given, and a base connected to the second end of the resistor R20. The constant current source I21 has a first end connected to the emitter of the transistor Q33, and a second end to which the second supply voltage VEE is given.

For example, the signal D11 output from the second end of the resistor R20 of the NOR gate CR5 swings from 0 V to −0.8 V. In this case, a signal D12 output to the emitter of the transistor Q33 swings from −0.8 V to −1.6 V which is lower by the base-emitter voltage VBE of the transistor Q33.

In the logic gate CR7, Q34 to Q36 designate NPN bipolar transistors, R22 and R23 designate resistors, and I22 designates a constant current source. The NPN bipolar transistor Q34 has an emitter, a collector and a base connected to the emitter of the transistor Q33. The NPN bipolar transistor Q35 has an emitter, a collector and a base connected to the emitter of the transistor Q28. The resistor R22 has a first end to which the first supply voltage VCC is given, and a second end connected to the collectors of the transistors Q34 and Q35 in common. The NPN bipolar transistor Q36 has a collector, an emitter connected to the emitters of the transistors Q34 and Q35 in common, and a base to which the reference voltage VBB is given. The resistor R23 has a first end to which the first supply voltage VCC is given, and a second end connected to the collector of the transistor Q36. The constant current source I22 has a first end connected to the emitters of the transistors Q34 to Q36 in common, and a second end to which the second supply voltage VEE is given.

It is assumed that the bases of the transistors Q34 and Q35 input the signal D12 swinging from −0.8 V to −1.6 V which is output from the emitter of the transistor Q33 and the signal D10 swinging from −0.8 V to −1.1 V which is output from the emitter of the transistor Q28, respectively. When both the transistors Q34 and Q35 are in the OFF state or either of them is in the ON state, the voltage drop is generated on the resistor R22 by the constant current of the constant current source I22 so that a signal D13 swinging from 0 V to −0.8 V is output from the second end of the resistor R22. The voltage drop is generated on the resistor R23 by ON/OFF of the transistor Q36 so that a signal D14 swinging from −0.8 V to 0 V is output from the second end of the resistor R23.

In the logic gate CR9, Q38 to Q40 designate NPN bipolar transistors, R24 designates a resistor, DO1 designates a diode, and I24 designates a constant current source. The NPN bipolar transistor Q38 has an emitter, a collector and a base for receiving the clock CK. The NPN bipolar transistor Q39 has an emitter connected to the emitter of the transistor Q38, a collector connected to the collector of the transistor Q38, and a base for receiving the output Q of the flip-flop circuit. The resistor R24 has a first end to which the first supply voltage VCC is given, and a second end connected to the collectors of the transistors Q38 and Q39 in common. The NPN bipolar transistor Q40 has a collector, an emitter connected to the emitters of the transistors Q38 and Q39 in common, and a base to which the reference voltage VBB is given. The diode DO1 has an anode to which the first supply voltage VCC is given, and a cathode connected to the collector of the transistor Q40. The constant current source I24 has a first end connected to the emitters of the transistors Q38 to Q40 in common, and a second end to which the second supply voltage VEE is given.

For example, the clock CK swinging from −0.8 V to −1.1 V and the output Q of the flip-flop circuit which swings from −0.8 V to −1.6 V are sent to the bases of the transistors Q38 and Q39, respectively. When both the transistors Q38 and Q39 are in the OFF state or either of them is in the ON state, a voltage is dropped on the resistor R24 by the constant current of the constant current source I24 so that a signal D15 swinging from 0 V to −0.8 V is output from the second end of the resistor R24. A signal D16 which is complementary to the signal D15 is output from the collector of the transistor Q40. The signal D16 swings from 0 V to 0.8 V, for example.

In the emitter followers CR8 and CR10, Q37 and Q42 designate NPN bipolar transistors, and I23 designates a constant current source. The NPN bipolar transistor Q37 has an emitter, a base connected to the second end of the resistor R22, and a collector to which the first supply voltage VCC is given. The NPN bipolar transistor Q42 has an emitter connected to the emitter of the transistor Q37, a base connected to the second end of the resistor R24, and a collector to which the first supply voltage VCC is given. The constant current source I23 has a first end connected to the emitters of the transistors Q37 and Q42 in common, and a second end to which the second supply voltage VEE is given.

If the signals D13 and D15 output from the second ends of the resistors R22 and R24 swing from 0 V to −0.8 V, the signal Q output to the emitters of the transistors Q37 and Q42 swings from −0.8 V to −1.6 V which is lower by the base-emitter voltage VBE of the transistors Q37 and Q42. Further, the emitters of the transistors Q37 and Q42 are connected in common so that a wired OR is formed. If a voltage of 0 V is given to the base of either of the transistors Q37 and Q42, the output QC of the flip-flop circuit has a voltage of −0.8 V.

In the emitter follower CR11, Q41 designates an NPN bipolar transistor and I25 designates a constant current source. The NPN bipolar transistor Q41 has an emitter, a base connected to the second ends of the resistors R23 and R24 in common, and a collector to which the first supply voltage VCC is given. The constant current source I25 has a first end connected to the emitter of the transistor Q41 and a second end to which the second supply voltage VEE is given. A signal output from the emitter of the transistor Q41 is the output Q of the flip-flop circuit.

For example, the signals D14 and D16 swinging from 0 V to −0.8 V are output from the second end of the resistor R23 and the cathode of the diode DO1, respectively. When the transistors Q36 and Q40 are in the ON state, a current flows from the constant current sources I22 and I24 to the load resistor R23 so that the output signal may have a potential of −0.8 V or less. For this reason, the diode DO1 clamps the voltage of the collector in such a manner that the collector does not have a potential of −0.8 V or less. In this case, an output Q is generated. The output Q has a voltage which is lower by the base-emitter voltage of the transistor Q41 than those of the signals D14 and D16. For example, a signal swinging from −0.8 V to −1.6 V is output. The collectors of the transistors Q36 and Q40 are connected to the base of the transistor Q41 in common. Consequently, a signal on the base of the transistor is 0 V when both the transistors Q36 and Q40 are in the OFF state, and a signal on the base of the transistor Q41 is −0.8 V when either of them is in the ON state. More specifically, the collectors of the transistors Q36 and Q40 are connected in common so that a wired AND is formed. In the NOR gate CR5 and the logic gates CR7 and CR9 which form the slave latch, the gates for logical operation are formed by only the transistors connected in parallel, such as the transistors Q30 to Q32, the transistors Q34 to Q36, and the transistors Q38 to Q40. Although the supply voltage is 3.3 V which is about 4 times as much as the voltage VBE across the forward-biased base-emitter junction of the transistor, the magnitude of the output signal can be increased to 0.8 V, for example. It is assumed that the voltage VBE across the forward-biased base-emitter of the transistor is 0.8 V and a voltage of 0.9 V is necessary to cause a transistor to operate. In this case, if a series gate is provided as in the master latch, power consumption can be controlled. However, if a voltage necessary for a transistor provided between a power supply and the emitter of the transistor which forms a differential pair by using a current mirror circuit on the constant current source is 0.9 V, the limit of operation is 3.3 V−0.9 V×3=0.6 V. Thus, it is hard to get a magnitude of 0.5 V for the output signal.

For this reason, if the supply voltage which is given is 3.3 V, the magnitude of an output signal is usually set to 0.3 V in the flip-flop circuit using an emitter-coupled logic with series gating circuit.

The master latch decreases a magnitude by means of the emitter-coupled logic with series gating so that power consumption can be reduced. The wiring between the master latch and the slave latch can be shortened. Consequently, it is hard for a malfunction to occur even if the magnitude of the master latch is decreased. According to the flip-flop circuit according to Embodiment 1, thus, the magnitude of the output signal can be increased while controlling the power consumption. For example, if the current mirror circuit is used for the constant current source or the flip-flop circuit is formed by only resistors, an output having a magnitude of 0.8 V can easily be obtained because of 3.3 V−0.9 V×2=1.5 V.

According to the embodiment described above, the transistors are used for the constant current sources I1, I3 to I6, and I20 to I25. For this reason, the difference between the first supply voltage VCC and the second supply voltage VBB should be 3.3 V or more. If the flip-flop circuit is formed by only resistors, the difference between the first supply voltage VCC and the second supply voltage VBB should be 2×VBE or more in order for the flip-flop circuit to operate. The upper bound is a value which is experimentally or experientially obtained, i.e., a little greater than 4VBE and smaller than 5VBE. The range in which the present invention is applied to get sufficient effects experimentally is 2VBE to 4.5VBE. This range is the same as in the following embodiments.

In the case where the flip-flop circuit described in Embodiment 1 is formed by a gate array, the magnitude center of the input signal D almost corresponds to that of the output signal Q. Consequently, the flip-flop circuit is treated as a cell so that a cell base can be designed more simply. These effects can also be obtained in Embodiments 2 to 6 which will be described below.

(Embodiment 2)

Figure 3:
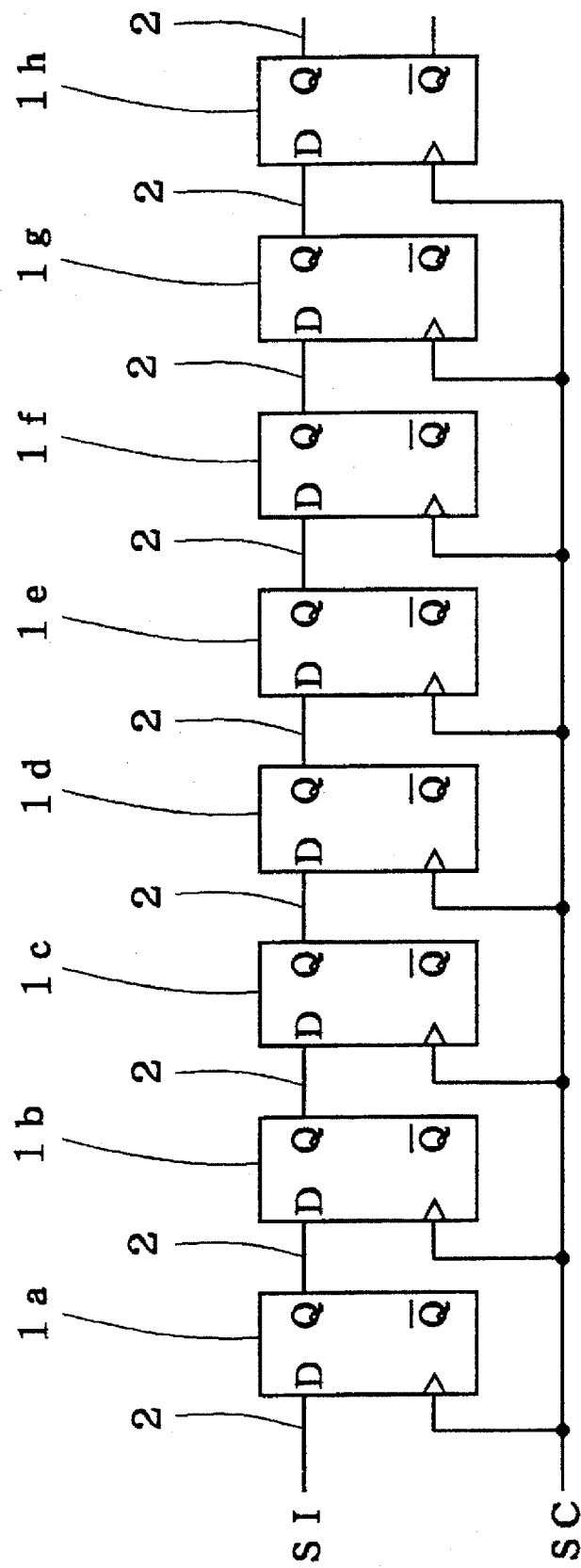
FIG. 3 is a block diagram showing an example of the structure of a shift register circuit according to Embodiment 2 of the present invention.

A shift register circuit according to Embodiment 2 of the present invention will be described below with reference to FIG. 3. In FIG. 3, the numeral references 1a to 1h indicate flip-flop circuits and the numeral reference 2 indicates wires. The flip-flop circuits 1a to 1h have the same structures as that of the flip-flop circuit according to Embodiment 1. The wires 2 transmit the input and output signals of the flip-flop circuits 1a to 1h. The flip-flop circuits 1a to 1h operate by the same clock SC. In the flip-flop circuits 1b to 1h, the output Q of the flip-flop circuits 1a to 1g is an input signal D. A signal SI input to the flip-flop circuit 1a is output through the flip-flop circuits 1a to 1h, so that an output signal SO is delayed by 8 clocks as compared with the input signal.

In the case where the shift register circuit shown in FIG. 3 is designed by a cell base with the automatic placement and routing, the structure of the flip-flop circuit is determined as a macro cell. The positions of the flip-flop circuits 1a to 1h and the position and length of the wires 2 which connect the flip-flop circuits 1a to 1h are automatically determined. Consequently, as the tolerance for the length of the wires 2 and the signal attenuation by the wires 2 are increased, the degree of freedom of the automatic arranged wiring can be enhanced so that the range and speed of the automatic arranged wiring is increased. The magnitudes of the output signals of the flip-flop circuits 1a to 1h can be set to 0.8 V even if a supply voltage is 3.3 V. Consequently, the tolerance for the length of the wires 2 and the signal attenuation by the wires 2 is increased.

(Embodiment 3)

Figure 4:
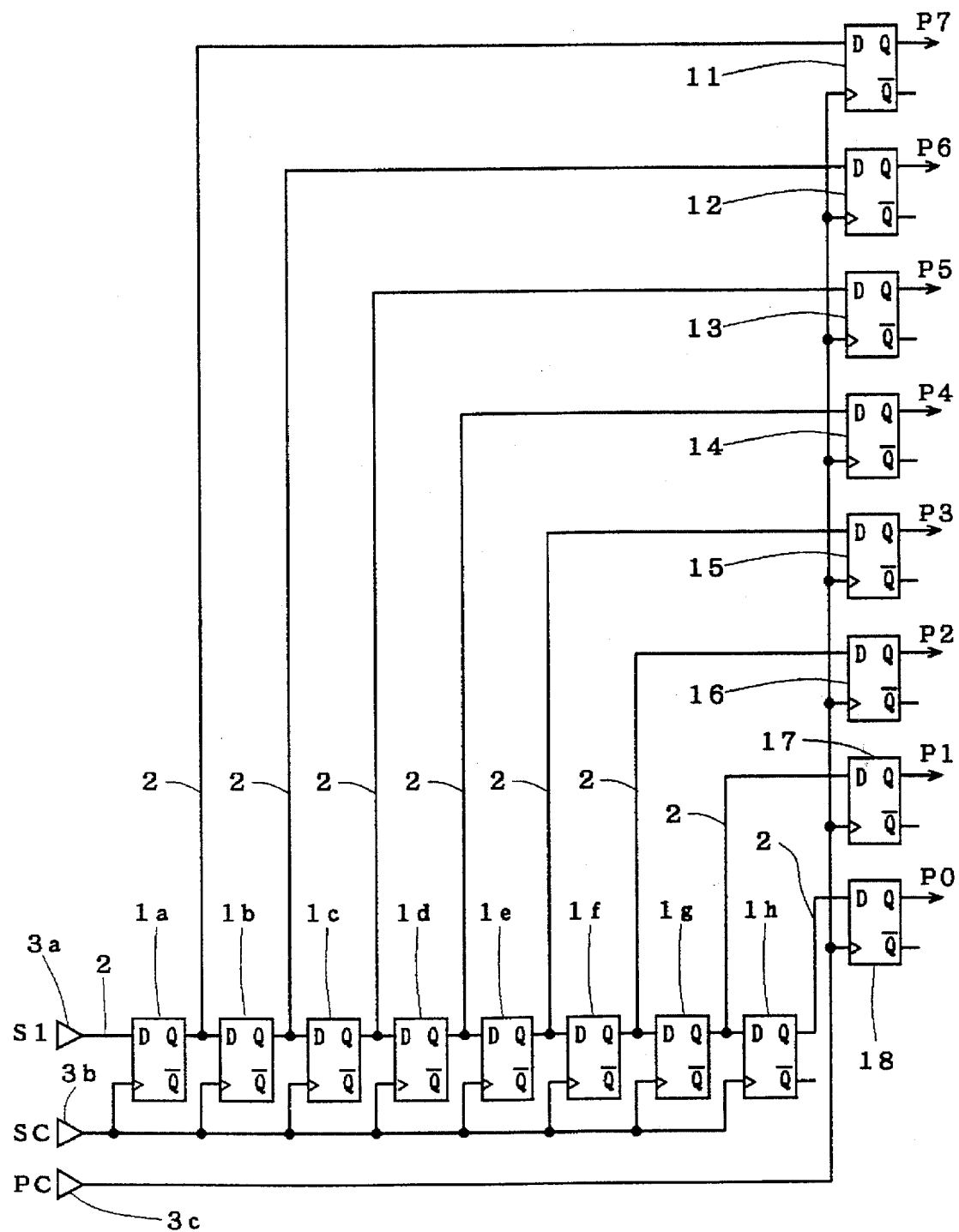
FIG. 4 is a block diagram showing an example of the structure of a serial-parallel converter according to Embodiment 3 of the present invention.

A serial-parallel converter according to Embodiment 3 of the present invention will be described below with reference to FIG. 4. FIG. 4 is a block diagram showing an example of the structure of the serial-parallel converter for inputting 8-bit data in series and outputting the same in parallel. In FIG. 4, the numeral references 1a to 1h and 11 to 18 indicate flip-flop circuits, the numeral reference 2 indicates wires, and the numeral references 3a to 3c indicate buffers. The flip-flop circuits 1a to 1h and 11 to 18 have the same structures as in Embodiment 1. The wires 2 transmit the signals of the flip-flop circuits 1a to 1h. The buffers 3a to 3c keep constant the output load impedance of the input data SI and the clocks SC and PC received by the flip-flop circuits, and reduces the influence thereof.

The flip-flop circuits 1a to 1h are connected in series in the same manner as in Embodiment 2. The clock SC is sent to the flip-flop circuits 1a to 1h through the buffer 3b. The clock PC is sent to the flip-flop circuits 11 to 18 through the buffer 3c. In the flip-flop circuits 11 to 18, a data input D is each of the outputs of the flip-flop circuits 1a to 1h. Data are sequentially input to the flip-flop circuits 1a to 1h in series in response to the clock SC. In the state where 8-bit data are input to the flip-flop circuits 1h to 1a in series, the flip-flop circuits 11 to 18 simultaneously input the data output from the flip-flop circuits 1a to 1h in response to the clock PC. The flip-flop circuits 11 to 18 output the 8-bit data as outputs P7 to P0 in parallel in response to the clock PC.

Also in such a serial-parallel converter, the flip-flop circuit shown in Embodiment 1 is used so that the wires 2 can be designed more freely than the prior art and the automatic placement and routing can easily be obtained.

(Embodiment 4)

Figure 5:
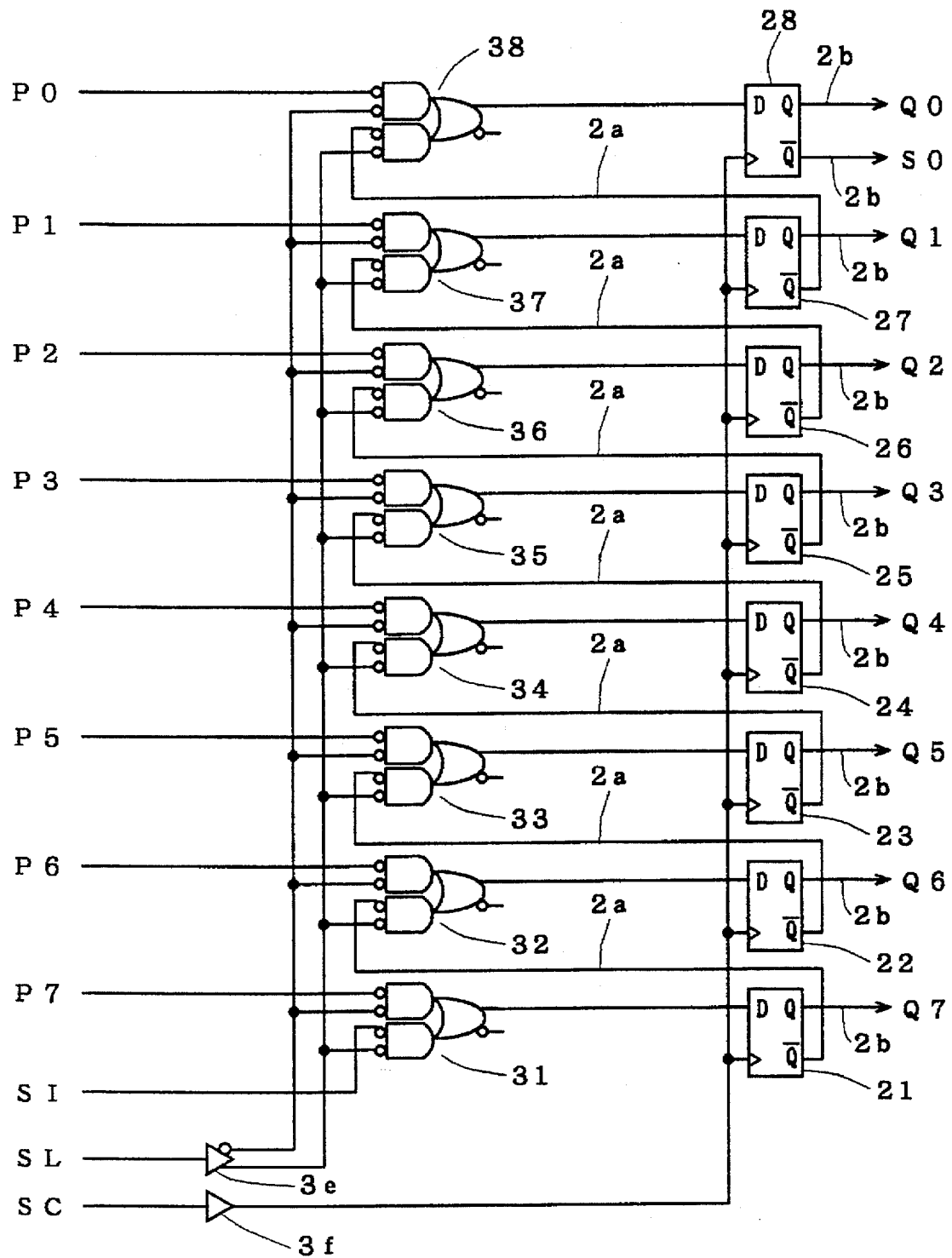
FIG. 5 is a block diagram showing an example of the structure of a parallel-serial converter according to Embodiment 4 of the present invention.

A serial-parallel converter according to Embodiment 4 of the present invention will be described below with reference to FIG. 5. FIG. 5 is a block diagram showing an example of the structure of the parallel-serial converter for inputting 8-bit data in parallel and outputting the same in series. In FIG. 5, the numeral references 21 to 28 indicate flip-flop circuits described in Embodiment 1, the numeral references 31 to 38 indicate AND-OR gates, the numeral reference 2a indicates wires between the flip-flop circuits 21 to 27 and the AND-OR gates 32 to 38, the numeral reference 2b indicates wires for the outputs of the flip-flop circuits 21 to 28, and the numeral references 3e and 3f indicate buffers. Each of the AND-OR gates 31 to 38 output OR of an output A which is obtained by the NOR operation of first and second inputs and an output B which is obtained by the NOR operation of third and fourth inputs. The buffers 3e and 3f keep constant the output load impedance of the clock SC received by the flip-flop circuits 21 to 28 and a selection signal SL received by the AND-OR gates 31 to 38, and reduce the influence thereof.

In the AND-OR gates 31 to 38, a signal having a logical value which is reverse to that of the selection signal SL is input to the second inputs through the buffer 3e and the selection signal SL is input to the fourth inputs through the buffer 3e in common. Data SI and the inverted output bars Q of the flip-flop circuits 21 to 27 are input to the third inputs of the AND-OR gates 31 to 38, respectively. The 8-bit data P7 to P0 are input to the first inputs of the AND-OR gates 31 to 38 in parallel. The outputs of the AND-OR gates 31 to 38 are sent to the data inputs D of the flip-flop circuits 21 to 28, respectively. With such a circuit structure, it is possible to select that the data input in parallel are output in parallel or in series by the the selection signal SL. When executing parallel-serial conversion the selection signal SL is set to the low potential side so that the outputs of the AND-OR gates 32 to 38 which receive the outputs of the flip-flop circuits 21 to 27 are determined in response to the inverted output bars Q of the flip-flop circuits 21 to 27.

Also in such a parallel-serial converter, the flip-flop circuit described in Embodiment 1 is used so that the wires 2a or 2b can be designed more freely than the prior art and the automatic placement and routing can easily be obtained in the same manner as in Embodiment 2.

(Embodiment 5)

Figure 6:
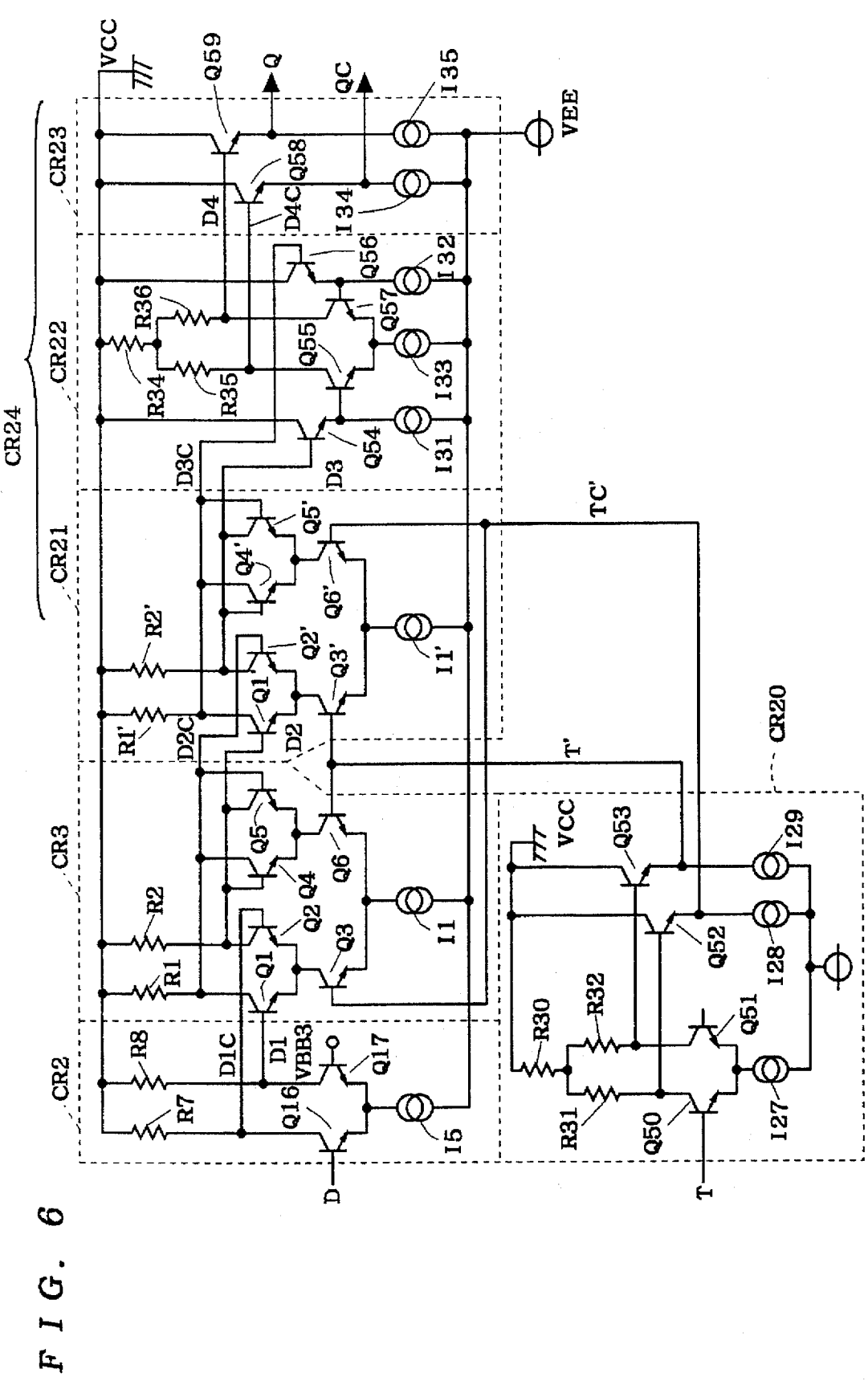
FIG. 6 is a circuit diagram showing the structure of a flip-flop circuit according to Embodiment 5 of the present invention.

A flip-flop circuit according to Embodiment 5 of the present invention will be described below with reference to FIG. 6. In FIG. 6, CR2 designates an input level converter, CR20 designates a clock buffer, CR3 designates a master latch, CR21 designates a latch portion, CR22 designates an amplifying portion, and CR23 designates an output portion. The input level converter CR2 converts the level of an input signal D swinging from $-1.05$ V to $-1.55$ V, and outputs a signal D1 swinging from 0 V to $-0.3$ V and a complementary signal D1C. The clock buffer CR20 inputs a clock T swinging from $-1.05$ V to $-1.55$ V, and outputs clocks T' and TC' swinging from $-0.9$ V to $-1.2$ V which are complementary to each other. The master latch CR3 inputs the signals D1 and D1C and the clocks T' and TC', holds a logical value of the signal D1 at the timing of the clock T', and outputs signals D2 and D2C in response to the logical value which is held. The latch portion CR21 inputs the signals D2 and D2C and the clocks T' and TC', holds a logical value of the signal D2 at the timing of the clock T', and outputs signals D3 and D3C swinging from 0 V to $-0.3$ V in response to the logical value which is held. The amplifying portion CR22 inputs and amplifies the signals D3 and D3C, and outputs signals D4 and D4C swinging from $-0.15$ V to $-0.65$ V in response to the signal D3. The output portion CR23 inputs the signal D4, converts the level of the signal D4, and outputs signals Q and QC swinging from $-1.05$ V to $-1.55$ V which are complementary to each other. The amplifying portion CR22 and the output portion CR23 form an output level converting portion.

Figure 11:
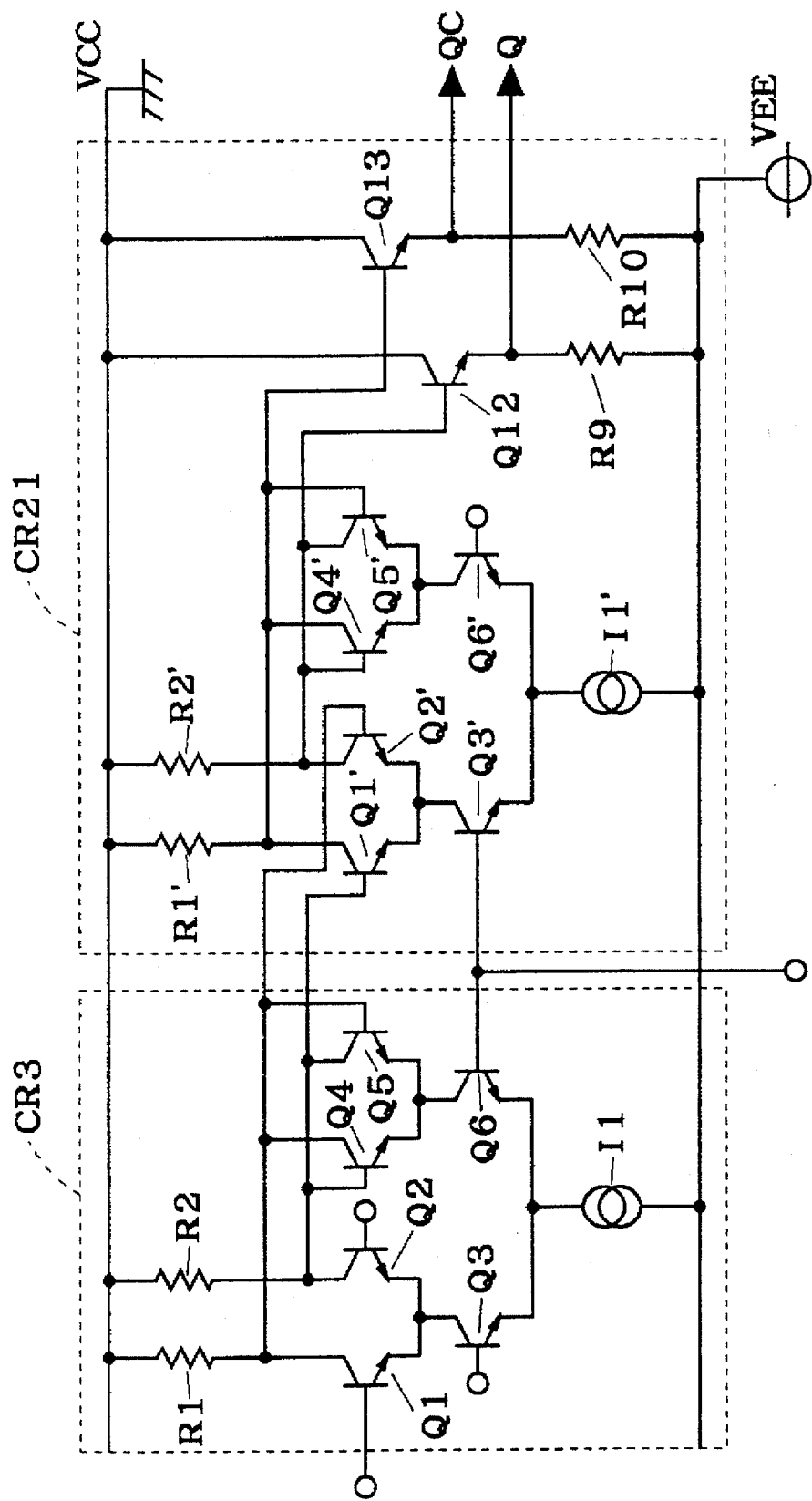
FIG. 11 is a circuit diagram for explaining the change of a structure added to the flip-flop circuit in order to correspond to a low supply voltage.
Figure 12:
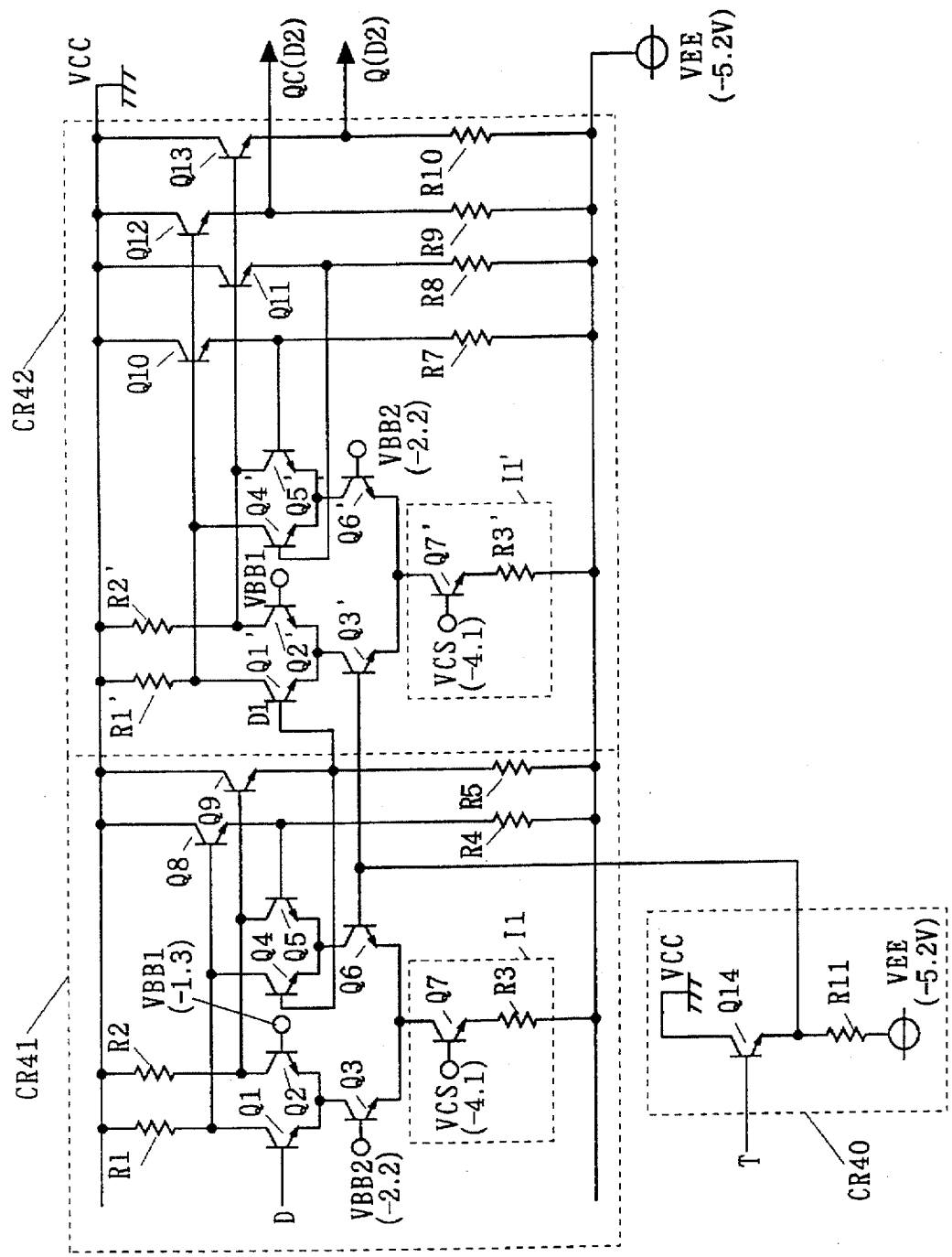
FIG. 12 is a circuit diagram showing the structure of a flip-flop circuit according to the prior art.

A slave latch CR24 is formed by the latch portion CR21, the amplifying portion CR22 and the output portion CR23. The latch portion CR21 has the same structure as that of a slave latch CR21 shown in FIG. 11.

The amplifying portion CR22 comprises NPN bipolar transistors Q54 to Q57, and resistors R34 to R36. The NPN bipolar transistor Q54 has a base for receiving the signal D3, a collector to which a first supply voltage VCC is given, and an emitter connected to the first end of a constant current source I31. The NPN bipolar transistor Q55 has an emitter connected to the first end of a constant current source I33, a base connected to the emitter of the transistor Q54, and a collector. The resistor R34 has a first end to which the first supply voltage VCC is given, and a second end. The resistor R35 has a first end connected to the second end of the resistor R34, and a second end connected to the collector of the transistor Q55. The resistor R36 has a first end connected to the second end of the resistor R34, and a second end. The NPN bipolar transistor Q56 has a base for receiving the signal D3C, a collector to which the first supply voltage VCC is given, and an emitter connected to the first end of a constant current source I32. The NPN bipolar transistor Q57 has a base connected to the emitter of the transistor Q56, a collector connected to the second end of the resistor R36, and an emitter connected to the first end of the constant current source I33. A second supply voltage VEE is given to the second ends of the constant current sources I31 to I33.

The flip-flop circuit shown in FIG. 6 differs from the flip-flop circuit shown in FIGS. 1 and 2 in that the structure of the slave latch CR12 is different from that of the slave latch CR24. In the slave latch CR12, an emitter-coupled logic with series gating is not used so that the number of transistors connected in series is reduced and the logic swing is enlarged when generating an output signal. On the other hand, the signal D3 output from the emitter-coupled logic with series gating is amplified by a Darlington connecting differential amplifier to generate the signal D4 in the slave latch CR24.

In the same manner as the transistors Q54 and Q55 and the transistors Q56 and Q57, the transistors are Darlington-connected to increase a current amplification factor so that signals can easily be amplified. The signals D3 and D3C which are complementary to each other are amplified by differential amplification so that a malfunction can be prevented from occurring. The voltages of the emitters of the transistors Q54 and Q56 swing from −0.9 V to −1.2 V. The voltage of the emitters of the transistors Q55 and Q57 is −1.8 V.

The output portion CR23 comprises NPN bipolar transistors Q58 and Q59. The NPN bipolar transistor Q59 has a base for receiving the signal D4, a collector to which the first supply voltage VCC is given, and an emitter connected to the first end of a constant current source I35. The NPN bipolar transistor Q58 has a base for receiving the signal D4C, a collector to which the first supply voltage VCC is given, and an emitter connected to the first end of a constant current source I34. The transistors Q58 and Q59 are emitter followers. The magnitude centers of the output signals Q and QC are set to −1.3 V by the transistors Q58 and Q59.

As described above, the flip-flop circuit according to Embodiment 5 sets the magnitude of the output signal of the slave latch CR24 greater than that of the master latch CR3 by the input level converter CR2 and the amplifying portion CR22 and output portion CR23 of the slave latch CR24. Consequently, a malfunction can be prevented from occurring often. In addition, the signal D whose magnitude meets standard requirements can be input and the signal Q whose magnitude meets standard requirements can be output.

While the flip-flop circuit described in Embodiment 1 is used in Embodiments 2 to 4, the flip-flop circuit described in Embodiment 5 can be used for the shift register circuit, the serial-parallel converter and the parallel-serial converter described in Embodiments 2 to 4. Also in this case, the same effects can be obtained as in the flip-flop circuit described in Embodiment 1.

(Embodiment 6)

Figure 7:
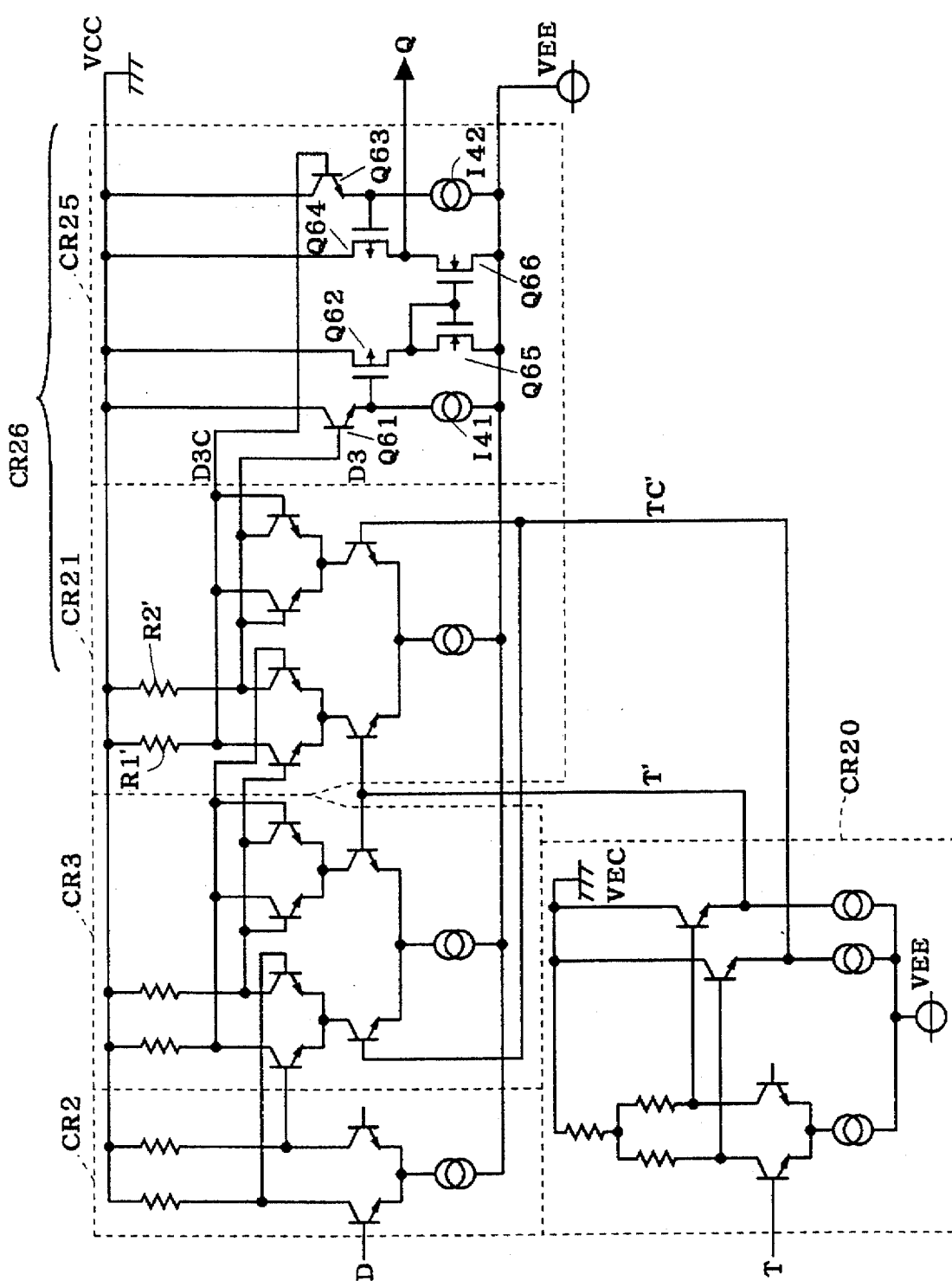
FIG. 7 is a circuit diagram showing the structure of a flip-flop circuit according to Embodiment 6 of the present invention.

A flip-flop circuit according to Embodiment 6 of the present invention will be described below with reference to FIG. 7. FIG. 7 is a circuit diagram showing the structure of the flip-flop circuit according to Embodiment 6 of the present invention. In FIG. 7, CR25 designates an output level converting portion. The output level converting portion CR25 receives signals D3 and D3C swinging from 0 V to −0.3 V which are output from a latch portion CR21, and outputs a signal Q swinging from −1.05 V to −1.55 V. In FIG. 7, the same reference numbers designate the same components as in FIG. 6.

The output level converting portion CR25 comprises NPN bipolar transistors Q61 and Q63, P-channel MOS transistors Q62 and Q64, and an N-channel MOS transistors Q65 and Q66. The NPN bipolar transistor Q61 has a base for receiving the signal D3, a collector to which a first supply voltage VCC is given, and an emitter connected to the first end of a constant current source I41. The P-channel MOS transistor Q62 has a gate connected to the emitter of the transistor Q61, a source to which the first supply voltage VCC is given, and a drain. The NPN bipolar transistor Q63 has a base for receiving the signal D3C, a collector to which the first supply voltage VCC is given, and an emitter connected to the first end of a constant current source I42. The P-channel MOS transistor Q64 has a gate connected to the emitter of the transistor Q63, a source to which the first supply voltage VCC is given, and a drain. The N-channel MOS transistor Q65 has a drain connected to the drain of the transistor Q62, a gate connected to the drain of the transistor Q62, and a source to which a second supply voltage VEE is given. The N-channel MOS transistor Q66 has a drain connected to the drain of the transistor Q64, a source to which the second supply voltage VEE is given, and a gate connected to the gate of the transistor Q65.

A current which flows to the transistors Q62 and Q65 is changed in response to the signal D3 sent to the base of the transistor Q61. For example, when the signal D3 has a voltage of −1.2 V, the current which flows to the transistor Q65 is decreased as compared with the case where the signal D3 has a voltage of −0.9 V. A current which flows to the transistor Q66 is also decreased. The transistors Q65 and Q66 form a current mirror. However, the signal D3C which is complementary to the signal D3 has a voltage of −0.9 V. For this reason, the resistance of the transistor Q64 is decreased and the voltage drop on the transistor Q63 is also reduced so that the signal Q has a voltage close to the first supply voltage VCC. If the signal D3 has a voltage of −1.2 V, the resistance of the transistor Q62 is decreased so that the current which flows to the transistors Q65 and Q66 is increased. Further, the resistance of the transistor Q64 is increased by the signal D3C. Consequently, the voltage drop on the transistor Q64 is increased so that the signal Q is set to the L level.

The output level converting portion CR25 can set the magnitude of the output signal greater than the output portion CR23 combined with the amplifying portion CR22 shown in FIG. 6. The output level converting portion CR25 can be used within the range of a voltage at which the transistors Q64 and Q66 are not inverted. When the threshold voltage of the transistor Q64 is expressed by VTHn and that of the transistor Q66 is expressed by VTHp, the magnitude can be set to the range of −3.3 V+VTHn to 0 V−|VTHp|.

As described above, the flip-flop circuit according to Embodiment 6 sets the magnitude of the output signal of a slave latch CR26 greater than that of a master latch CR3 by an input level converter CR2 and the output level converting portion CR25 of the slave latch CR26. Consequently, a malfunction can be prevented from occurring often. In addition, the signal D whose magnitude meets standard requirements can be input and the signal Q whose magnitude meets standard requirements can be output.

While the flip-flop circuit described in Embodiment 1 is used in Embodiments 2 to 4, the flip-flop circuit described in Embodiment 6 can be used for the shift register circuit, the serial-parallel converter and the parallel-serial converter described in Embodiments 2 to 4. Also in this case, the same effects can be obtained as in the flip-flop circuit described in Embodiment 1.

Figure 8:
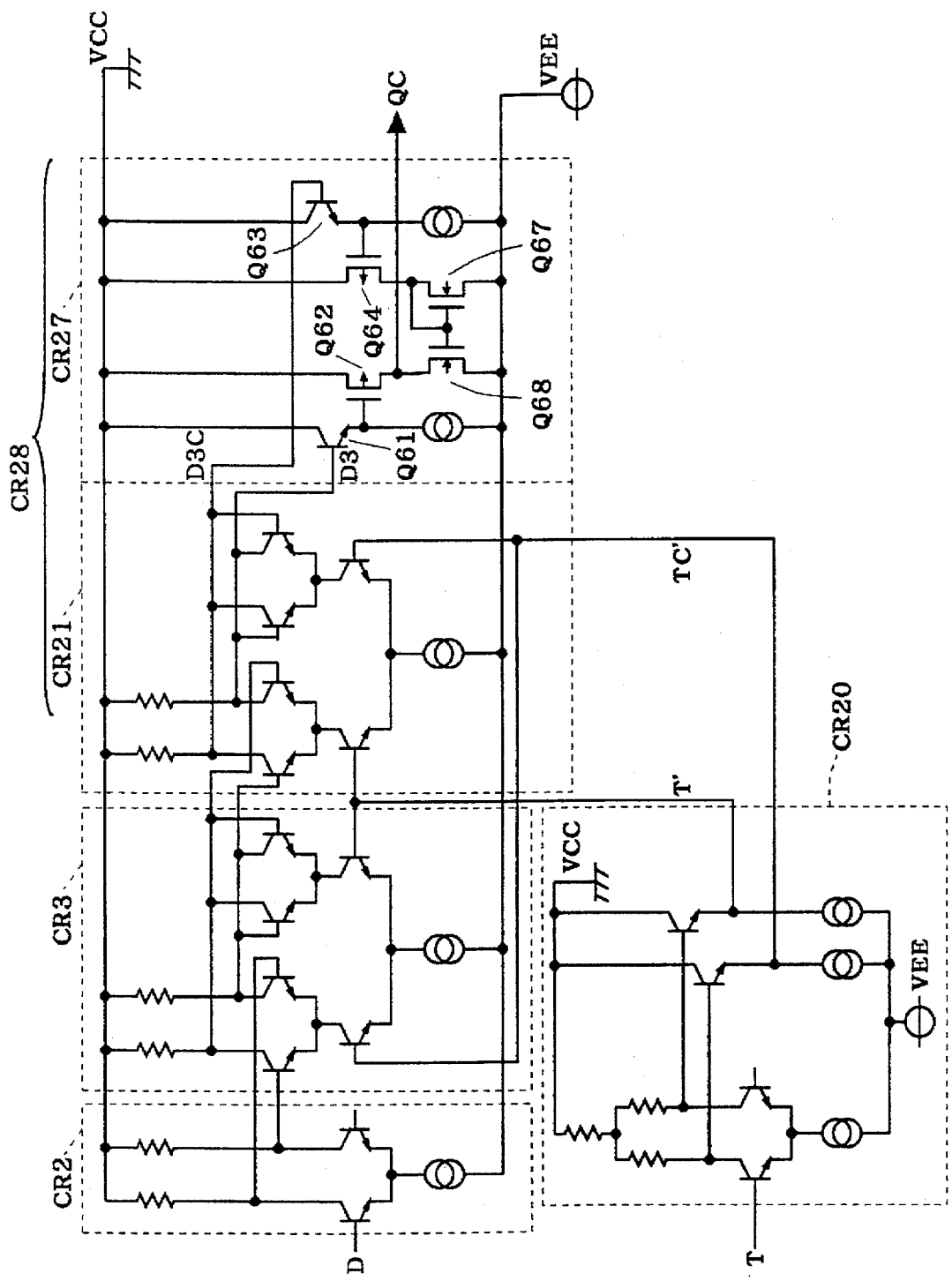
FIG. 8 is a circuit diagram showing the structure of another flip-flop circuit according to Embodiment 6 of the present invention.

The flip-flop circuit shown in FIG. 8 outputs a signal QC which is complementary to the output Q of the flip-flop circuit shown in FIG. 7. The flip-flop circuit shown in FIG. 8 differs from the flip-flop circuit shown in FIG. 7 in that the output level converting portions of the slave latches CR28 and CR26 are different from each other. The gates of transistors Q67 and Q68 which form the current mirror of the output level converting portion CR27 are connected to the drain of the transistor Q64. The gates, to which the transistors Q65 and Q66 of the output level converting portion CR25 are connected, are connected to the drain of the transistor Q62.

(Embodiment 7)

Figure 9:
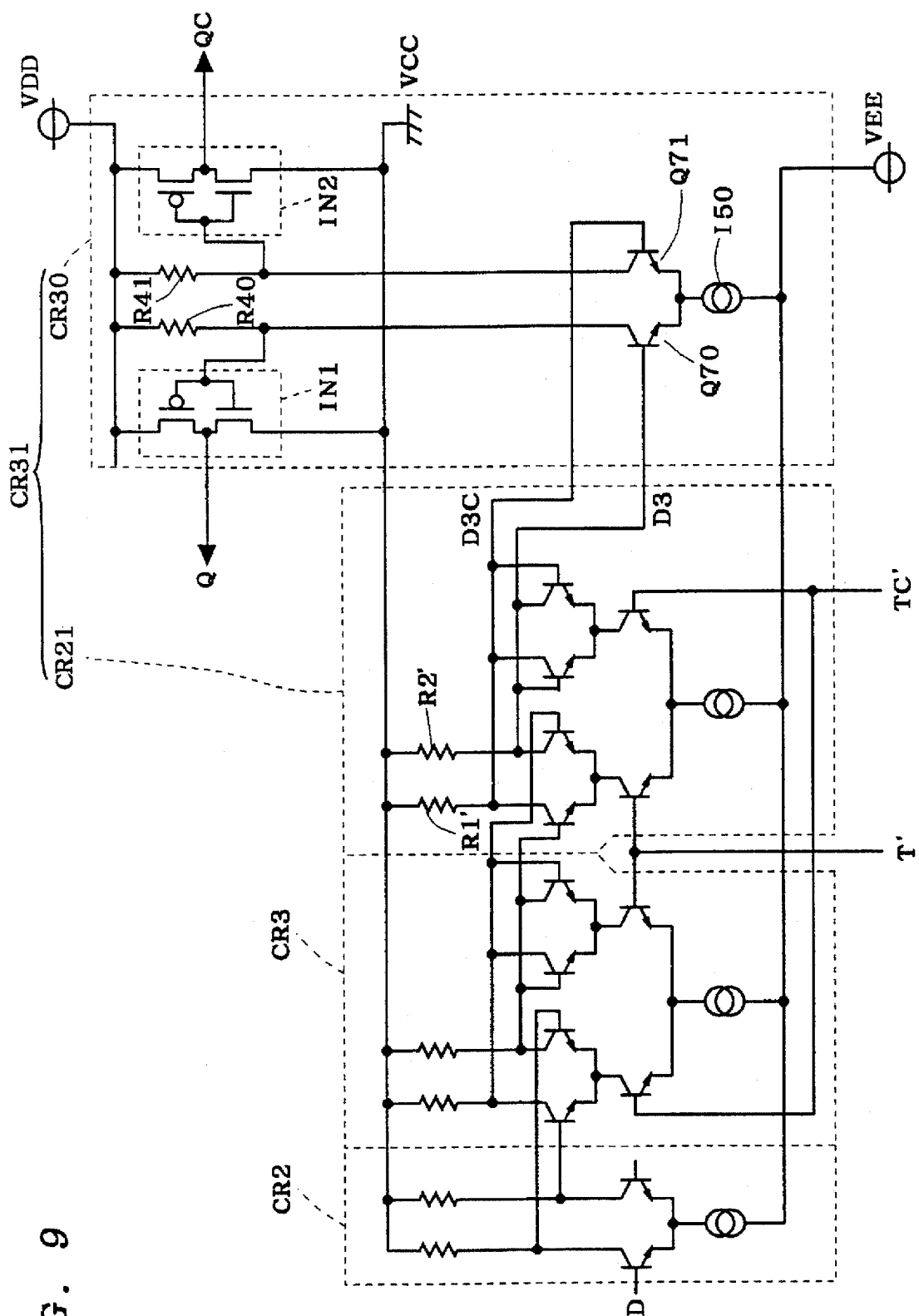
FIG. 9 is a circuit diagram showing the structure of a flip-flop circuit according to Embodiment 7 of the present invention.

A flip-flop circuit according to Embodiment 7 of the present invention will be described below with reference to FIG. 9. FIG. 9 is a circuit diagram showing the structure of the flip-flop circuit according to Embodiment 7 of the present invention. In FIG. 9, CR30 designates an output level converting portion. The output level converting portion CR30 inputs signals D3 and D3C swinging from 0 V to −0.3 V, and converts the signals D3 and D3C to an output signal Q swinging from 0 V to 3.3 V at which a MOS transistor operates. In FIG. 9, the same reference numbers designate the same components as in FIG. 6. The output signals Q and QC shown in FIG. 6 have the logic swing within the range of VTHn to 3.3 V−|VTHp| which is expressed by the threshold voltage of the transistor forming a CMOS inverter. In some cases, an ECL operates at a negative voltage and a CMOS circuit operates at a positive voltage. For example, in the case where a signal having the logic swing within the range of the positive voltage is output to the CMOS circuit, the ECL receives and processes a signal having the logic swing within the range of the negative voltage and directly converts the level of the same signal to the signal level of the CMOS circuit. Consequently, the magnitude can easily be increased and unnecessary level conversion is not executed. Thus, the processing speed can be enhanced and the structure of a circuit can be simplified.

A third supply voltage VDD is used, which is different from first and second supply voltages VCC and VEE that are mainly used for the operation of the flip-flop circuit. Output signals Q and QC are generated by the first and third supply voltages VCC and VDD. Consequently, it is possible to increase the magnitude of the signal output from a slave latch CR31 more easily as compared with a master latch CR3. The magnitude of the output signal is increased so that a malfunction can be prevented.

The output level converting portion CR30 comprises NPN bipolar transistors Q70 and Q71, resistors R40 and R41, a CMOS inverter IN1, and an inverter IN2. The NPN bipolar transistor Q70 has a base for receiving the signal D3, an emitter connected to the first end of a constant current source I50, and a collector. The NPN bipolar transistor Q71 has a base for receiving the signal D3C, an emitter connected to the first end of the constant current source I50, and a collector. The resistor R40 has a first end to which the third supply voltage VDD is given, and a second end connected to the collector of the transistor Q70. The resistor R41 has a first end to which the third supply voltage VDD is given, and a second end connected to the collector of the transistor Q71. The CMOS inverter IN1 operates on receipt of the first and third supply voltages VCC and VDD and has a gate connected to the second end of the resistor R40. The inverter IN2 operates on receipt of the first and third supply voltages VCC and VDD, and has a gate connected to the second end of the resistor R41.

When the signal D3 has a voltage of 0 V and the signal D3C has a voltage of −0.3 V, the voltage of the emitters of the transistors Q70 and Q71 is −0.9 V. At the same time that the transistor Q70 is turned ON, the transistor Q71 is turned OFF. Since the transistor Q70 is in the ON state, a current flows to the resistor R40 so that the voltage drop is generated. Consequently, the voltage of the second end of the resistor R40 is smaller than the logical threshold of the inverter IN1 so that the inverter IN1 output the H level as a signal Q. In this case, since the transistor Q71 is OFF, a current flows to the resistor R41 so that the voltage drop is generated. Consequently, the voltage of the second end of the resistor R41 is greater than the logical threshold of the inverter IN2 so that the inverter IN2 outputs the L level as a signal QC.

In order to protect the transistors Q70 and Q71, diodes may forward be connected between the resistors R40 and R41 and the collectors of the transistors Q70 and Q71, respectively.

According to the flip-flop circuit described above, the signals Q and QC are output by means of the inverters IN1 and IN2. Even if another circuit such as an emitter follower is used, the same effects can be obtained as in Embodiment described above.

The flip-flop circuit described above is used on the last stage of the flip-flop circuits connected in series which are described in the Embodiments 2 to 4, processes the signal of the ECL circuit and directly outputs a signal to another CMOS circuit. Consequently, the CMOS circuit and the ECL circuit can also be interfaced simultaneously.

The flip-flop circuit described above is used for the flip-flop circuits connected in parallel which are described in Embodiments 3 and 4, processes the signal of the ECL circuit and directly outputs a signal to another CMOS circuit. Consequently, the CMOS circuit and the ECL circuit can also be interfaced simultaneously.

(Embodiment 8)

Figure 10:
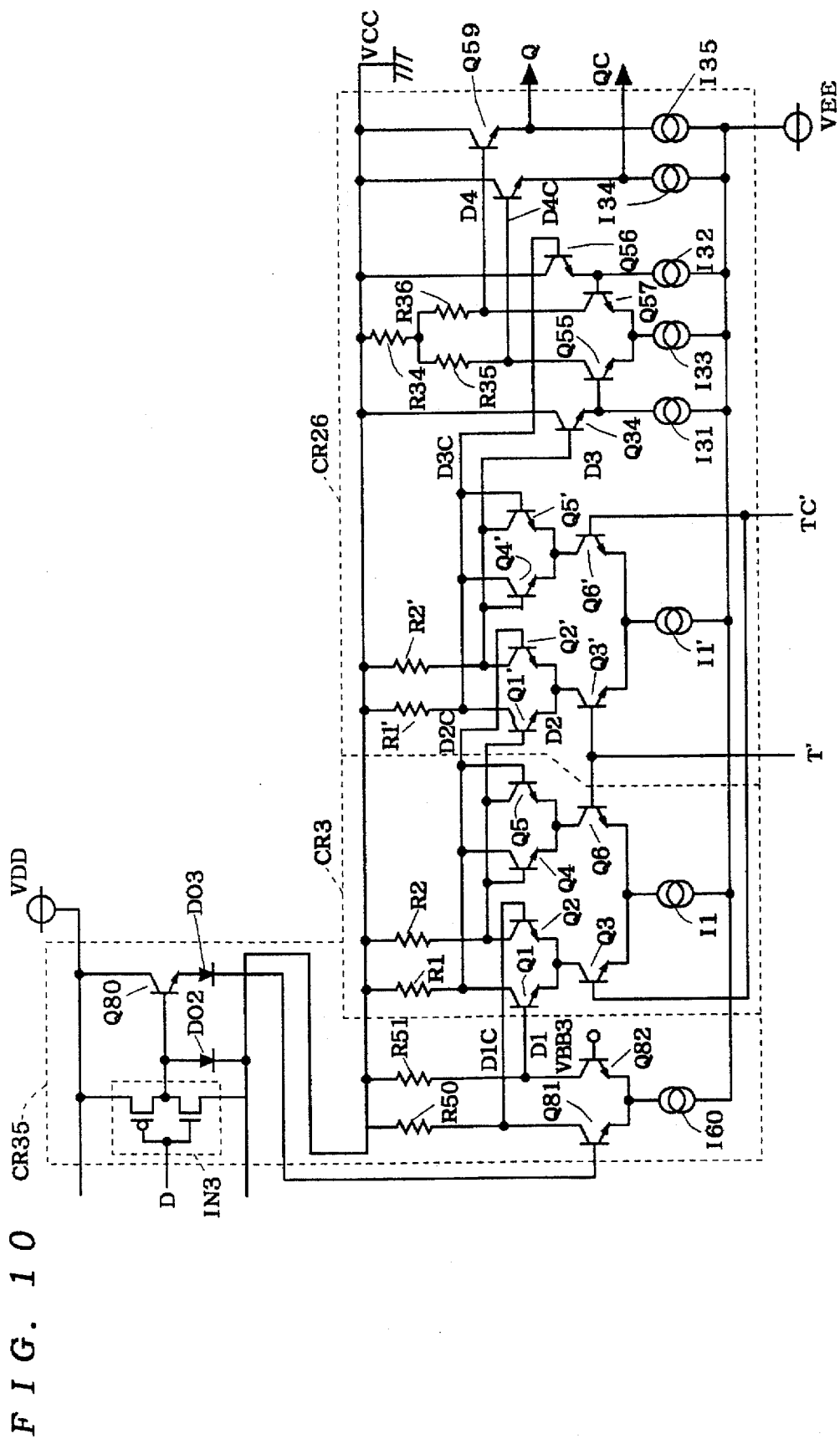
FIG. 10 is a circuit diagram showing the structure of a flip-flop circuit according to Embodiment 8 of the present invention.

A flip-flop circuit according to Embodiment 8 of the present invention will be described below with reference to FIG. 10. FIG. 10 is a circuit diagram showing the structure of the flip-flop circuit according to Embodiment 8 of the present invention. In FIG. 10, CR35 designates an input level converting portion. The input level converting portion CR35 inputs a signal D swinging from about 0 V to −3.3 V and outputs signals D1 and D1C swinging from 0 V to −0.3 V. In FIG. 10, the same reference numbers designate the same components as in FIG. 6. In general, the input signal D shown in FIG. 6 have the logic swing within the range of VTHn to 3.3 V−|VTHp| which is expressed by the threshold voltage of the transistor forming a CMOS inverter. In some cases, an ECL operates at a negative voltage and a CMOS circuit operates at a positive voltage. In the case where a signal having the logic swing within the range of the positive voltage and processed by the CMOS circuit is input, the ECL receives and processes a signal having the logic swing within the range of the negative voltage, and directly converts the signal level of the CMOS circuit to a negative voltage suitable for the ECL. Consequently, unnecessary level conversion is not executed. Thus, the processing speed can be enhanced and the structure of a circuit can be simplified. In the same manner as in Embodiment 6, the magnitude of the output of the slave latch CR26 can be set greater than that of the output of the master latch. The same effects can be obtained as in the flip-flop circuit according to Embodiment 6.

Further, the flip-flop circuit of Embodiment 8 is combined with that of Embodiment 7 so that the CMOS circuit and the ECL circuit can freely be incorporated in an integrated circuit formed on a substrate.

The input level converting portion CR35 comprises an inverter IN3, diodes DO2 and DO3, NPN bipolar transistors Q80 to Q82, a constant current source I60, and resistors R50 and R51. The inverter IN3 has an input terminal for receiving the input signal D, and an output terminal. The diode DO2 has an anode connected to the output terminal of the inverter IN3, and a cathode to which a first supply voltage VCC is given. The NPN bipolar transistor Q80 has an emitter, a collector to which a third supply voltage VDD is given, and a base connected to the output terminal of the inverter IN3. The diode DO3 has a cathode and an anode connected to the emitter of the transistor Q80. The constant current source I60 has a first end and a second end to which a second supply voltage VEE is given. The NPN bipolar transistor Q81 has a collector, an emitter connected to the first end of the constant current source I60, and a base connected to the cathode of the diode DO3. The NPN bipolar transistor Q82 has a collector, a base to which a reference voltage VBB is given, and an emitter connected to the first end of the constant current source I60. The resistor R50 has a first end to which the first supply voltage VCC is given, and a second end connected to the collector of the transistor Q81. The resistor R51 has a first end to which the first supply voltage VCC is given, and a second end connected to the collector of the transistor Q82.

It is assumed that the input level converting portion CR35 inputs a signal D swinging from 0 V to 3.3 V. The output of the inverter IN3 is restricted by the diode DO2 and swings from 0 V to 0.9 V. A signal which is generated on the emitter of the transistor Q80 is lower by a base-emitter forward voltage VBE than a signal sent to the base of the transistor Q80 so that it swings from 0 V to −0.9 V. The voltage of the cathode of the diode DO3 is lower by 0.9 V than that of the emitter of the transistor Q80 so that it swings from −0.9 V to −1.8 V. For example, the reference voltage VBB is set to −1.3 V and signals D1 and D1C swinging from 0 V to −0.3 V are generated on the second ends of the resistors R51 and R50 respectively.

In the flip-flop circuit described above, the inverter IN3 is used to receive the signal D. Another buffer circuit can be used to receive the signal. Also in this case, the same effects can be obtained as in Embodiment described above.

The flip-flop circuit described above is used on the first stage of the flip-flop circuits connected in series which are described in Embodiments 2 and 3, processes the signal of the CMOS circuit and directly outputs a signal to another ECL circuit. Consequently, the CMOS circuit and the ECL circuit can also be interfaced simultaneously.

While the invention has been described in detail, the foregoing description is in all aspects illustrative and not restrictive. It is understood that numerous other modifications and variations can be devised without departing from the scope of the invention.

What is claimed is:

1. A flip-flop circuit having a bipolar transistor formed in a semiconductor integrated circuit for operating on receipt of first and second supply voltages having a difference of 2 to 4.5 times as much as a voltage across a forward-biased base-emitter junction of the bipolar transistor comprising:

an input level converter for receiving an input signal having a magnitude which is based on a first voltage level between said first and second supply voltages and whose peak value does not reach said first and second supply voltages, and for outputting, in response to said input signal, a first signal having a magnitude which is based on a second voltage level closer to said first supply voltage than said first voltage level between said first and second supply voltages and whose peak value reaches said first supply voltage;

a master latch including an emitter-coupled logic with series gating for inputting said first signal and a clock having a magnitude which is based on a third voltage level closer to said second supply voltage than said second voltage level between said first and second supply voltages, and for holding a logical value of said first signal and outputting a second signal having a magnitude which is based on a fourth voltage level that is almost the same as said second voltage level and whose peak value reaches the first supply voltage in response to said logical value of said first signal which is held; and a slave latch for inputting said second signal, and for holding a logical value of said second signal and outputting a third signal having a magnitude which is based on a fifth voltage level that is almost the same as said first voltage level in response to said logical value of said second signal which is held, wherein said magnitude of said third signal is set greater than said magnitude of said second signal.

2. The flip-flop circuit according to claim 1, wherein said slave latch comprises:

an intermediate signal level converting portion for inputting the second signal, and for outputting, in response to the second signal, a fourth signal having a magnitude which is based on a sixth voltage level closer to said second supply voltage than said first voltage level between said first and second supply voltages; and a latch portion for inputting said clock and said fourth signal, and for holding a logical value of said fourth signal and outputting said third signal in response to said logical value of said fourth signal which is held, wherein said latch portion comprises at least two transistors only connected in parallel for logical operation.

3. The flip-flop circuit according to claim 2, wherein said intermediate signal level converting portion comprises:

a first bipolar transistor having a collector configured to receive said first supply voltage, a base to which the second signal is sent, and an emitter for outputting the fourth signal; and a first constant current source having a first end connected to said emitter of said first bipolar transistor, and a second end configured to receive said second supply voltage, and wherein said latch portion comprises;

first resistor means having a first end configured to receive said first supply voltage, and a second end, second resistor means having a first end configured to receive said first supply voltage, and a second end, a second bipolar transistor having a base configured to receive said clock, an emitter, and a collector connected to said second end of said first resistor means, a third bipolar transistor having a base, an emitter connected to said emitter of said second bipolar transistor, and a collector connected to said second end of said first resistor means, a fourth bipolar transistor having a collector connected to said second end of said second resistor means, a base to which a reference voltage is given, and an emitter connected to said emitter of said second bipolar transistor, a second constant current source having a first end connected to said emitters of said second to fourth bipolar transistors in common, and a second end configured to receive said second supply voltage, a fifth bipolar transistor having a base connected to said second end of said first resistor means, a collector configured to receive said first supply voltage, and an emitter, a third constant current source having a first end connected to said emitter of said fifth bipolar transistor, and a second end configured to receive said second supply voltage, third resistor means having a first end configured to receive said first supply voltage, and a second end, fourth resistor means having a first end configured to receive said first supply voltage, and a second end, a sixth bipolar transistor having a base connected to said emitter of said fifth bipolar transistor, a collector connected to said second end of said third resistor means, and an emitter, a seventh bipolar transistor having a base connected to said emitter of said first bipolar transistor, an emitter connected to said emitter of said sixth bipolar transistor, and a collector connected to said second end of said third resistor means, an eighth bipolar transistor having a collector connected to said second end of said fourth resistor means, a base configured to receive said reference voltage, and an emitter connected to said emitter of said sixth bipolar transistor, a fourth constant current source having a first end connected to said emitters of said sixth to eighth bipolar transistors in common, and a second end configured to receive said second supply voltage, fifth resistor means having a first end configured to receive said first supply voltage, and a second end, a ninth bipolar transistor having a collector connected to said second end of said fifth resistor means, a base configured to receive said clock and an emitter, a tenth bipolar transistor having a collector connected to said second end of said fifth resistor means, a base, and an emitter connected to said emitter of said ninth bipolar transistor, diode means having a first electrode configured to receive said first supply voltage and a second electrode, and connected forward, an eleventh bipolar transistor having a collector connected to said second electrode of said diode means, a base configured to receive said reference voltage, and an emitter connected to said emitter of said ninth bipolar transistor, a fifth constant current source having a first end connected to said emitters of said ninth to eleventh bipolar transistors in common and a second end configured to receive said second supply voltage, a twelfth bipolar transistor having a base connected to said second end of said third resistor means, a collector configured to receive said first supply voltage, and an emitter connected to said base of said third bipolar transistor, a sixth constant current source having a first end connected to said emitter of said twelfth bipolar transistor, and a second end configured to receive said second supply voltage, a thirteenth bipolar transistor having a base connected to said second end of said fifth resistor means, a collector configured to receive said first supply voltage, and an emitter connected to said emitter of said twelfth bipolar transistor, a fourteenth bipolar transistor having a base connected to said second end of said fourth resistor means and said second electrode of said diode means in common, a collector configured to receive said first supply voltage, and an emitter connected to said base of said tenth bipolar transistor, a seventh constant current source having a first end connected to said emitter of said fourteenth bipolar transistor, and a second end configured to receive said second supply voltage, wherein said third signal has a voltage between said emitter of said fourteenth bipolar transistor and said second supply voltage.

4. The flip-flop circuit according to claim 1, wherein said slave latch comprises:

a latch portion including an emitter-coupled logic with series gating for inputting said clock and said second signal, and for holding said logical value of said second signal and outputting a fourth signal having a magnitude which is based on said third voltage level in response to said logical value of said second signal which is held, and an output level converting portion for inputting said fourth signal, and for generating and outputting said third signal in response to said fourth signal.

5. The flip-flop circuit according to claim 4, wherein said output level converting portion comprises:

a first bipolar transistor having a base configured to receive said fourth signal, a collector configured to receive said first supply voltage, and an emitter, a first constant current source having a first end connected to said emitter of said first bipolar transistor, and a second end configured to receive said second supply voltage, first resistor means having a first end configured to receive said first supply voltage, and a second end, second resistor means having a first end configured to receive said first supply voltage, and a second end, a second bipolar transistor having a base connected to said emitter of said first bipolar transistor, a collector connected to said second end of said first resistor means, and an emitter, a third bipolar transistor having a base configured to receive a signal complementary to said second signal, a collector configured to receive said first supply voltage, and an emitter, a second constant current source having a first end connected to said emitter of said third bipolar transistor, and a second end configured to receive said second supply voltage, a fourth bipolar transistor having a collector connected to said end of said second resistor means, a base connected to said emitter of said third bipolar transistor, and an emitter connected to said emitter of said second bipolar transistor, a third constant current source having a first end connected to said emitters of said second and fourth bipolar transistors in common, and a second end to which said second supply voltage is given, a fifth bipolar transistor having a base connected to said second end of said first resistor means, a collector configured to receive said first supply voltage, and an emitter, and a fourth constant current source having a first end connected to said emitter of said fifth bipolar transistor, and a second end configured to receive said second supply voltage.

6. The flip-flop circuit according to claim 4, wherein said output level converting portion comprises:

a first bipolar transistor having a base configured to receive said fourth signal or a signal complementary to said either fourth signal, a collector configured to receive said first supply voltage, and an emitter;

a first constant current source having a first end connected to said emitter of said first bipolar transistor, and a second end configured to receive said second supply voltage;

a first insulated-gate transistor having a gate connected to said emitter of said first bipolar transistor, a source connected to said first supply voltage, and a drain;

a second bipolar transistor having a base to which a signal that is complementary to the signal sent to said base of said first bipolar transistor is sent, a collector configured to receive said first supply voltage, and an emitter;

a second constant current source having a first end connected to said emitter of said second bipolar transistor, and a second end configured to receive said second supply voltage;

a second insulated-gate transistor having a gate connected to said emitter of said second bipolar transistor, a source connected to said first supply voltage, and a drain;

a third insulated-gate transistor having a drain connected to said drain of said first insulated-gate transistor, a source configured to receive said second supply voltage, and a gate connected to said drain of said first insulated-gate transistor; and a fourth insulated-gate transistor having a drain connected to said drain of said first insulated-gate transistor, a source configured to receive said second supply voltage, and a gate connected to said drain of said second insulated-gate transistor.

7. The flip-flop circuit according to claim 1, wherein said semiconductor integrated circuit includes a gate array large-scale integrated circuit formed by a plurality of transistors which are provided in an array on a semiconductor substrate, and wherein said input level converter, said master latch and said slave latch are used for said gate array large-scale integrated circuit.

8. A shift register circuit formed in a semiconductor integrated circuit comprising:

a flip-flop circuit including a bipolar transistor formed in the semiconductor integrated circuit for operating on receipt of first and second supply voltages having a difference of 2 to 4.5 times as much as a voltage across a forward-biased base-emitter junction of the bipolar transistor comprising:

an input level converter for receiving an input signal having a magnitude which is based on a first voltage level between said first and second supply voltages and whose peak value does not reach said first and second supply voltages and for outputting, in response to said input signal, a first signal having a magnitude which is based on a second voltage level closer to said first supply voltage than said first voltage level between said first and second supply voltages and whose peak value reaches said first supply voltage, a master latch including an emitter-coupled logic with series gating for inputting said first signal and a clock having a magnitude which is based on a third voltage level closer to said second supply voltage than said second voltage level between said first and second supply voltages, and for holding a logical value of said first signal and outputting a second signal having a magnitude which is based on a fourth voltage level that is almost the same as said second voltage level and whose peak value reaches the first supply voltage in response to said logical value of said first signal which is held, and a slave latch for inputting said second signal, and for holding a logical value of said second signal and outputting a third signal having a magnitude which is based on a fifth voltage level that is almost the same as said first voltage level in response to said logical value of said second signal which is held.

wherein said magnitude of said third signal is set greater than said magnitude of said second signal.

9. A serial-parallel converter formed in a semiconductor integrated circuit comprising:

a flip-flop circuit including a bipolar transistor formed in the semiconductor integrated circuit for operating on receipt of first and second supply voltages having a difference of 2 to 4.5 times as much as a voltage across a forward-biased base-emitter junction of the bipolar transistor comprising:

an input level converter for receiving an input signal having a magnitude which is based on a first voltage level between said first and second supply voltages and whose peak value does not reach said first and second supply voltages, and for outputting, in response to said input signal, a first signal having a magnitude which is based on a second voltage level closer to said first supply voltage than said first voltage level between said first and second supply voltages and whose peak value reaches said first supply a master latch including an emitter-coupled logic with series gating for inputting said first signal and a clock having a magnitude which is based on a third voltage level closer to said second supply voltage than said second voltage level between said first and second supply voltages, and for holding a logical value of said first signal and outputting a second signal having a magnitude which is based on a fourth voltage level that is almost the same as said second voltage level and whose peak value reaches the first supply voltage in response to said logical value of said first signal which is held, and a slave latch for inputting said second signal, and for holding a logical value of said second signal and outputting a third signal having a magnitude which is based on a fifth voltage level that is almost the same as said first voltage level in response to said logical value of said second signal which is held, wherein said magnitude of said third signal is set greater than said magnitude of said second signal.

10. A parallel-serial converter formed in a semiconductor integrated circuit comprising:

a flip-flop circuit having a bipolar transistor formed in the semiconductor integrated circuit for operating on receipt of first and second supply voltages having a difference of 2 to 4.5 times as much as a voltage across a forward-biased base-emitter junction of the bipolar transistor comprising:

an input level converter for receiving an input signal having a magnitude which is based on a first voltage level between said first and second supply voltages and whose peak value does not reach said first and second supply voltages, and for outputting, in response to said input signal, a first signal having a magnitude which is based on a second voltage level closer to said first supply voltage than said first voltage level between said first and second supply voltages and whose peak value reaches said first supply voltage, a master latch including an emitter-coupled logic with series gating for inputting said first signal and a clock having a magnitude which is based on a third voltage level closer to said second supply voltage than said second voltage level between said first and second supply voltages, and for holding a logical value of said first signal and outputting a second signal having a magnitude which is based on a fourth voltage level that is almost the same as said second voltage level and whose peak value reaches the first supply voltage in response to said logical value of said first signal which is held, and a slave latch for inputting said second signal, and for holding a logical value of said second signal and outputting a third signal having a magnitude which is based on a fifth voltage level that is almost the same as said first voltage level in response to said logical value of said second signal which is held, wherein said magnitude of said third signal is set greater than said magnitude of said second signal.

11. The converter of claim 10, wherein said slave latch comprises:

an intermediate signal level converting portion for inputting the second signal, and for outputting, in response to the second signal, a fourth signal having a magnitude which is based on a sixth voltage level closer to said second supply voltage than said first voltage level between said first and second supply voltages; and a latch portion for inputting said clock and said fourth signal, and for holding a logical value of said fourth signal and outputting said third signal in response to said logical value of said fourth signal which is held, wherein said latch portion comprises at least two transistors only connected in parallel for logical operation.

12. The converter of claim 11, wherein said intermediate signal level converting portion comprises:

a first bipolar transistor having a collector configured to receive said first supply voltage, a base to which the second signal is sent, and an emitter for outputting the fourth signal; and a first constant current source having a first end connected to said emitter of said first bipolar transistor, and a second end to which said second supply voltage is given, and wherein said latch portion comprises:

first resistor means having a first end configured to receive said first supply voltage, and a second end, second resistor means having a first end configured to receive said first supply voltage, and a second end, a second bipolar transistor having a base configured to receive said clock an emitter, and a collector connected to said second end of said first resistor means, a third bipolar transistor having a base, an emitter connected to said emitter of said second bipolar transistor, and a collector connected to said second end of said first resistor means, a fourth bipolar transistor having a collector connected to said second end of said second resistor means, a base to which a reference voltage is given, and an emitter connected to said emitter of said second bipolar transistor, a second constant current source having a first end connected to said emitters of said second to fourth bipolar transistors in common, and a second end configured to receive said second supply voltage, a fifth bipolar transistor having a base connected to said second end of said first resistor means, a collector configured to receive said first supply voltage, and an emitter, a third constant current source having a first end connected to said emitter of said fifth bipolar transistor, and a second end configured to receive said second supply voltage, third resistor means having a first end to which said first supply voltage is given, and a second end, fourth resistor means having a first end configured to receive said first supply voltage, and a second end, a sixth bipolar transistor having a base connected to said emitter of said fifth bipolar transistor, a collector connected to said second end of said third resistor means, and an emitter, a seventh bipolar transistor having a base connected to said emitter of said first bipolar transistor, an emitter connected to said emitter of said sixth bipolar transistor, and a collector connected to said second end of said third resistor means, an eighth bipolar transistor having a collector connected to said second end of said fourth resistor means, a base configured to receive said reference voltage, and an emitter connected to said emitter of said sixth bipolar transistor, a fourth constant current source having a first end connected to said emitters of said sixth to eighth bipolar transistors in common, and a second end configured to receive said second supply voltage, fifth resistor means having a first end configured to receive said first supply voltage, and a second end, a ninth bipolar transistor having a collector connected to said second end of said fifth resistor means, a base configured to receive said clock and an emitter, a tenth bipolar transistor having a collector connected to said second end of said fifth resistor means, a base, and an emitter connected to said emitter of said ninth bipolar transistor, diode means having a first electrode configured to receive said first supply voltage and a second electrode, and connected forward, an eleventh bipolar transistor having a collector connected to said second electrode of said diode means, a base configured to receive said reference voltage, and an emitter connected to said emitter of said ninth bipolar transistor, a fifth constant current source having a first end connected to said emitters of said ninth to eleventh bipolar transistors in common and a second end configured to receive said second supply voltage, a twelfth bipolar transistor having a base connected to said second end of said third resistor means, a collector configured to receive said first supply voltage, and an emitter connected to said base of said third bipolar transistor, a sixth constant current source having a first end connected to said emitter of said twelfth bipolar transistor, and a second end configured to receive said second supply voltage, a thirteenth bipolar transistor having a base connected to said second end of said fifth resistor means, a collector configured to receive said first supply voltage, and an emitter connected to said emitter of said twelfth bipolar transistor, a fourteenth bipolar transistor having a base connected to said second end of said fourth resistor means and said second electrode of said diode means in common, a collector configured to receive said first supply voltage, and an emitter connected to said base of said tenth bipolar transistor, a seventh constant current source having a first end connected to said emitter of said fourteenth bipolar transistor, and a second end configured to receive said second supply voltage, wherein said third signal has a voltage between said emitter of said fourteenth bipolar transistor and said second supply voltage.

13. The converter of claim 11, wherein the slave latch comprises:
    a latch portion including an emitter-coupled logic with series gating for inputting said clock and said second signal, and for holding said logical value of said second signal and outputting a fourth signal having a magnitude which is based on said third voltage level in response to said logical value of said second signal which is held; and
    an output level converting portion for inputting said fourth signal, and for generating and outputting said third signal in response to said fourth signal.

14. A flip-flop circuit having a bipolar transistor formed in a semiconductor integrated circuit for operating on receipt of a first and second supply voltages having a difference of 2 to 4.5 times as much as a voltage across a forward-biased base-emitter junction of the bipolar transistor and a third supply voltage having a predetermined relationship with said first and second supply voltages comprising:
    an input level converter for receiving an input signal having a magnitude which is based on a first voltage level between said first and second supply voltages and whose peak value does not reach said first and second supply voltages, and for outputting, in response to said input signal, a first signal having a magnitude which is based on a second voltage level closer to said first supply voltage than said first voltage level between said first and second supply voltages and whose peak value reaches said first supply voltage;
    a master latch including an emitter-coupled logic with series gating for inputting said first signal and a clock having a magnitude which is based on a third voltage level closer to said second supply voltage than said second voltage level between said first and second supply voltages, and for holding a logical value of said first signal and outputting a second signal having a magnitude which is based on a fourth voltage level that is almost the same as said second voltage level and whose peak value reaches the first supply voltage in response to said logical value of said first signal which is held; and
    a slave latch for inputting said second signal, and for holding a logical value of said second signal and outputting a third signal having a magnitude which is based on a fifth voltage level that is almost the same as said first voltage level in response to said logical value of said second signal which is held,
    wherein said predetermined relationship means that said first supply voltage is present between said second and third supply voltages.

15. The flip-flop circuit according to claim 14, wherein said slave latch comprises:
    a latch portion including an emitter-coupled logic with series gating for inputting said clock and said second signal, and for holding said logical value of said second signal and outputting a fourth signal having a magnitude which is based on said third voltage level in response to said logical value of said second signal which is held; and
    an output level converting portion for inputting said fourth signal, and for generating an outputting said third signal in response to said fourth signal, and
    wherein said output level converting portion comprises;
    first resistor means having a first end configured to receive said third supply voltage, and a second end,
    second resistor means having a first end configured to receive said third supply voltage, and a second end,
    a first bipolar transistor having a base configured to receive said fourth signal, a collector connected to said second end of said first resistor means, and an emitter,
    a second bipolar transistor having a collector connected to said second end of said second resistor means, a base configured to receive a signal complementary to said fourth signal and an emitter connected to said emitter of said first bipolar transistor,
    a constant current source having a first end connected to said emitters of said first and second bipolar transistors in common, and a second end configured to receive said second supply voltage, and
    signal generating means for outputting said third signal in response to a voltage of said second end of said first resistor means.

16. The flip-flop circuit according to claim 14, wherein said semiconductor integrated circuit includes a gate array large-scale integrated circuit, formed by a plurality of transistors which are provided in an array on a semiconductor substrate, and
    wherein said input level converter, said master latch and said slave latch are used for said gate array large-scale integrated circuit.

17. A shift register circuit having a plurality of flip-flop circuits which are formed in a semiconductor integrated circuit and connected in series, wherein a last stage of said plurality of flip-flop circuits comprises:
    a flip-flop circuit having a bipolar transistor for operating on receipt of a first and second supply voltages having a difference of 2 to 4.5 times as much as a voltage across a forward-biased base-emitter junction of the bipolar transistor and a third supply voltage having a predetermined relationship with said first and second supply voltages, said flip-flop circuit comprising:
        an input level converter for receiving an input signal having a magnitude which is based on a first voltage level between said first and second supply voltages and whose peak value does not reach said first and second supply voltages and for outputting, in response to said input signal, a first signal having a magnitude which is based on a second voltage level closer to said first supply voltage than said first voltage level between said first and second supply voltages and whose peak value reaches said first supply voltage, master latch including an emitter-coupled logic with series gating for inputting said first signal and a clock having a magnitude which is based on a third voltage level closer to said second supply voltage than said second voltage level between said first and second supply voltages, and for holding a logical value of said first signal and outputting a second signal having a magnitude which is based on a fourth voltage level that is almost the same as said second voltage level and whose peak value reaches the first supply voltage in response to said logical value of said first signal which is held, and a slave latch for inputting said second signal, and for holding a logical value of said second signal and outputting a third signal having a magnitude which is based on a fifth voltage level that is almost the same as said first voltage level in response to said logical value of said second signal which is held, wherein said predetermined relationship means that said first supply voltage is present between said second and third supply, voltages.

18. A serial-parallel converter comprising:

a plurality of first flip-flop circuits which are formed in a semiconductor integrated circuit and connected in series; and a plurality of second flip-flop circuits which are formed in said semiconductor integrated circuit and provided corresponding to said plurality of first flip-flop circuits respectively, and which store outputs of corresponding said first flip-flop circuits and output signals at the same timing;

wherein at least one of said second flip-flop circuits includes, a bipolar transistor for operating on receipt of a first and second supply voltages having a difference of 2 to 4.5 times as much as a voltage across a forward-biased base-emitter junction of the bipolar transistor and a third supply voltage having a predetermined relationship with said first and second supply, voltages comprising:

an input level converter for receiving an input signal having a magnitude which is based on a first voltage level between said first and second supply voltages and whose peak value does not reach said first and second supply voltages, and for outputting, in response to said input signal, a first signal having a magnitude which is based on a second voltage level closer to said first supply voltage than said first voltage level between said first and second supply, voltages and whose peak value reaches said first supply, voltage;

a master latch including an emitter-coupled logic with series gating for inputting said first signal and a clock having a magnitude which is based on a third voltage level closer to said second supply voltage than said second voltage level between said first and second supply voltages, and for holding a logical value of said first signal and outputting a second signal having a magnitude which is based on a fourth voltage level that is almost the same as said second voltage level and whose peak value reaches the first supply voltage in response to said logical value of said first signal which is held, and a slave latch for inputting said second signal, and for holding a logical value of said second signal and outputting a third signal having a magnitude which is based on a fifth voltage level that is almost the same as said first voltage level in response to said logical value of said second signal which is held, wherein said predetermined relationship means that said first supply voltage is present between said second and third supply voltages.

19. A parallel-serial converter comprising:

a plurality of AND-OR gates formed in a semiconductor integrated circuit for outputting a plurality of signal, which are sequentially input at different timings in parallel; and a plurality of flip-flop circuits which are formed corresponding to said AND-OR gates in a semiconductor integrated circuit, and which store said outputs of corresponding said AND-OR gates and output signals at the same timing, wherein at least one of said plurality of flip-flop circuits includes:

a bipolar transistor for operating on receipt of a first and second supply voltages having a difference of 2 to 4.5 times as much as a voltage across a forward-biased base-emitter junction of the bipolar transistor and a third supply voltage having a predetermined relationship with said first and second supply voltages comprising:

an input level converter for receiving an input signal having a magnitude which is based on a first voltage level between said first and second supply voltages and whose peak value does not reach said first and second supply voltages, and for outputting, in response to said input signal, a first signal having a magnitude which is based on a second voltage level closer to said first supply voltage than said first voltage level between said first and second supply voltages and whose peak value reaches said first supply voltage, master latch including an emitter-coupled logic with series gating for inputting said first signal and a clock having a magnitude which is based on a third voltage level closer to said second supply voltage than said second voltage level between said first and second supply voltages, and for holding a logical value of said first signal and outputting a second signal having a magnitude which is based on a fourth voltage level that is almost the same as said second voltage level and whose peak value reaches the first supply voltage in response to said logical value of said first signal which is held, and a slave latch for inputting said second signal, and for holding a logical value of said second signal and outputting a third signal having a magnitude which is based on a fifth voltage level that is almost the same as said first voltage level in response to said logical value of said second signal which is held, wherein said predetermined relationship means that said first supply voltage is present between said second and third supply voltages.

20. A flip-flop circuit having a bipolar transistor formed in a semiconductor integrated circuit for operating on receipt of first and second supply voltages having a difference of 2 to 4.5 times as much as a voltage across a forward-biased base-emitter junction of the bipolar transistor comprising:

an input level converter for receiving an input signal having a magnitude which is based on a first voltage level between said first and second supply voltages and whose peak value does not reach said first and second supply voltages, and for outputting, in response to said input signal, a first signal having a magnitude which is based on a second voltage level closer to said first supply voltage than said first voltage level between said first and second supply voltages and whose peak value reaches said first supply voltage;

a master latch including an emitter-coupled logic with series gating for inputting said first signal and a clock having a magnitude which is based on a third voltage level closer to said second supply voltage than said second voltage level between said first and second supply voltages, and for holding a logical value of said first signal and outputting a second signal having a magnitude which is based on a fourth voltage level that is almost the same as said second voltage level and whose peak value reaches the first supply voltage in response to said logical value of said first signal which is held; and a slave latch for inputting said second signal, and for holding a logical value of said second signal and outputting a third signal having a magnitude which is based on a fifth voltage level that is almost the same as said first voltage level in response to said logical value of said second signal which is held, wherein said predetermined relationship means that said first supply voltage is present between said second and third supply voltages.

21. The flip-flop circuit according to claim 20, wherein said input level converter comprises:

buffer means which has an input terminal for receiving said input signal and an output terminal for outputting a fourth signal in response to said input signal, and prevents an electrically bad influence from occurring between a circuit for outputting said input signal and a circuit for receiving said fourth signal;

first diode means having a first electrode connected to said output terminal of said buffer means and a second electrode configured to receive said first supply voltage;

a first bipolar transistor having a collector configured to receive said third supply voltage, a base connected to said first electrode of said first diode means, and an emitter;

second diode means having a first electrode connected to said emitter of said first bipolar transistor, and a second electrode;

a second bipolar transistor having a base connected to said second electrode of said second diode means, an emitter and a collector;

first resistor means having a first end configured to receive said first supply voltage, and second end connected to said collector of said bipolar transistor;

a first constant current source having a first end connected to said emitter of said second bipolar transistor, and a second end configured to receive said first supply voltage, and a second end;

a third bipolar transistor having a collector connected to said second end of said second resistor means, an emitter connected to said emitter of the second bipolar transistor, and a base configured to receive a reference voltage; and a second constant current source having a first end connected to said emitters of said second and third bipolar transistors in common, and a second end configured to receive said second supply voltage, wherein said first signal is outputted from said second end of said second resistor means.

22. The flip-flop circuit according to claim 20, wherein said semiconductor integrated circuit includes a gate array large-scale integrated circuit, formed by a plurality of transistors which are provided in an array on a semiconductor substrate, and wherein said input level converter, said master latch and said slave latch are used for said gate array large-scale integrated circuit.

23. A shift register circuit comprising:

a plurality of flip-flop circuits; and a semiconductor integrated circuit on which said plurality of flip-flop circuits are formed and connected in series, wherein a first stage of said plurality of flip-flop circuits comprises a bipolar transistor formed in the semiconductor integrated circuit for operating on receipt of first and second supply voltages having a difference of 2 to 4.5 times as much as a voltage, across a forward-biased base-emitter junction of the bipolar transistor comprising:

an input level converter for receiving an input signal having a magnitude which is based on a first voltage level between said first and second supply voltages and whose peak value does not reach said first and second supply voltages, and for outputting, in response to said input signal, a first signal having a magnitude which is based on a second voltage level closer to said first supply voltage than said first voltage level between said first and second supply voltages and whose peak value reaches said first supply voltage, a master latch including an emitter-coupled logic with series gating for inputting said first signal and a clock having a magnitude which is based on a third voltage level closer to said second supply voltage than said second voltage level between said first and second supply voltages, and for holding a logical value of said first signal and outputting a second signal having a magnitude which is based on a fourth voltage level that is almost the same as said second voltage level and whose peak value reaches the first supply voltage in response to said logical value of said first signal which is held, and a slave latch for inputting said second signal and for holding a logical value of said second signal and outputting a third signal having a magnitude which is based on a fifth voltage level that is almost the same as said first voltage level in response to said logical value of said second signal which is held, wherein said predetermined relationship means that held first supply voltage is present between said second and third supply voltages.

24. A serial-parallel converter comprising:

a plurality of first flip-flop circuits which are formed in a semiconductor integrated circuit and connected in series; and a plurality of second flip-flop circuits which are formed in said semiconductor integrated circuit and provided corresponding to said plurality of first flip-flop circuits respectively, and which store outputs of corresponding said first flip-flop circuits and output signals at the same timing, wherein a first stage of said plurality of first flip-flop circuits includes a bipolar transistor formed in the semiconductor integrated circuit for operating on receipt of first and second supply voltages having a difference of 2 to 4.5 times as much as a voltage across a forward-biased base-emitter junction of the bipolar transistor comprising:

an input level converter for receiving an input signal having a magnitude which is based on a first voltage level between said first and second supply voltages and whose peak value does not reach said first and second supply voltages, and for outputting, in response to said input signal, a first signal having a magnitude which is based on a second voltage level closer to said first supply voltage than said first voltage level between said first and second supply voltages and whose peak value reaches said first supply voltage, a master latch including an emitter-coupled logic with series gating for inputting said first signal and a clock having a magnitude which is based on a third voltage level closer to said second supply voltage than said second voltage level between said first and second supply voltages, and for holding a logical value of said first signal and outputting a second signal having a magnitude which is based on a fourth voltage level that is almost the same as said second voltage level and whose peak value reaches the first supply voltage in response to said logical value of said first signal which is held, and a slave latch for inputting said second signal, and for holding a logical value of said second signal and outputting a third signal having a magnitude which is based on a fifth voltage level that is almost the same as said first voltage level in response to said logical value of said second signal which is held, wherein said predetermined relationship means that said first supply voltage is present between said second and third supply voltages.

* * * * *